(12) United States Patent
Yamashita

(10) Patent No.: US 8,075,098 B2
(45) Date of Patent: Dec. 13, 2011

(54) ELECTRONIC APPARATUS AND FLEXIBLE WIRING MEMBER

(75) Inventor: Toru Yamashita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 605 days.

(21) Appl. No.: 12/142,689

(22) Filed: Jun. 19, 2008

(65) Prior Publication Data

US 2008/0316273 A1 Dec. 25, 2008

(30) Foreign Application Priority Data

Jun. 19, 2007 (JP) ................. 2007-161118

(51) Int. Cl.
*B41J 2/14* (2006.01)
*B41J 2/05* (2006.01)

(52) U.S. Cl. .......................... 347/50; 347/58

(58) Field of Classification Search .......... 347/50, 347/57–59
See application file for complete search history.

(56) References Cited

U.S. PATENT DOCUMENTS

| 7,207,653 | B2 * | 4/2007 | Ito | 347/50 |
|---|---|---|---|---|
| 7,258,423 | B2 * | 8/2007 | Nakamura | 347/50 |
| 7,294,952 | B2 | 11/2007 | Ito | |
| 7,441,874 | B2 * | 10/2008 | Sugahara | 347/50 |

FOREIGN PATENT DOCUMENTS

| JP | S57-104566 | | 6/1982 |
|---|---|---|---|
| JP | H03-079468 | | 8/1991 |
| JP | H05-327135 | A | 12/1993 |
| JP | 2001-024362 | A | 1/2001 |
| JP | 2005322850 | A | 11/2005 |
| JP | 2006-135183 | A | 5/2006 |
| JP | 2006-253294 | A | 9/2006 |
| JP | 2007083707 | A | 4/2007 |

OTHER PUBLICATIONS

Japan Patent Office, Notice of Reasons for Rejection for Japanese Patent Application No. 2007-161118 (counterpart to above-captioned patent application), mailed Feb. 23, 2011.

* cited by examiner

*Primary Examiner* — An Do
(74) *Attorney, Agent, or Firm* — Baker Botts L.L.P.

(57) ABSTRACT

An electronic apparatus includes an electrical load and a flexible wiring member, on which a circuit element is mounted, and which transmits a signal from an external signal source to the electrical load via the circuit element, by a plurality of electroconductive wires. The flexible wiring member is a band-shaped member, and on one surface of the flexible wiring member, an output electrode for connecting to the electrical load is formed in an area facing the electrical load and a connecting electrode for mounting the circuit element is formed in a drawing area in which the electroconductive wires are drawn from the electrical load. An opening is formed in the drawing area and the flexible wiring member is folded such that the circuit element is exposed, through the opening to a side of the other surface of the flexible wiring member.

27 Claims, 14 Drawing Sheets

US 8,075,098 B2

ELECTRONIC APPARATUS AND FLEXIBLE WIRING MEMBER

CROSS REFERENCE TO RELATED APPLICATION

The present application claims priority from Japanese Patent Application No. 2007-161118, filed on Jun. 19, 2007, the disclosure of which is incorporated herein by reference in its entirety.

BACKGROUND OF THE INVENTION

1. Field of the Invention

The present invention relates to a flexible wiring member on which a circuit element is mounted, and an electronic apparatus which connects an electrical load and an external signal source by the flexible wiring member.

2. Description of the Related Art

A jetting apparatus which jets liquid droplets is an example of an electronic apparatus. The jetting apparatus includes a jetting head in which nozzles for jetting the liquid droplets are formed. The jetting head includes an actuator as an electrical load, and the actuator has a drive portion corresponding to each of the nozzles. The liquid droplets are jetted from the nozzles by applying selectively a jetting pressure to a liquid inside the jetting head by the drive portion, based on a signal input to the drive portion of the actuator from an external signal source via a flexible wiring member. In such a jetting apparatus, when the number of nozzles is increased and the density of the nozzles becomes high, the density of the drive portions also becomes high. Accordingly, a wiring pattern of the flexible wiring member to be connected to the drive portions becomes fine, and a resistance of the wiring pattern becomes high. In the flexible wiring member, a circuit element which drives the actuator is mounted at a position as near as possible to the actuator in order to suppress the increase of the resistance.

As a flexible wiring member, a both-sides wired type, in which a wiring pattern is formed on both surfaces of a base layer, is available. However, there are problems such as a rise in a cost, and limitations on making fine a wiring pitch. Therefore, single-side wired material in which a wiring pattern is formed on one surface of a base layer has been generally used. The one-side wired material has electroconductive wires wired on one surface of a base layer which is made of an insulating resin material, and a covering layer made of an insulating resin is provided to cover the electroconductive wires. In the flexible wiring member, at a mounting position on which the circuit element is mounted, at a position on which an output electrode for connecting to an actuator is formed, and at a position on which an input electrode for connecting to an external signal source is formed, an electrode is formed by partially exposing the electroconductive wire by removing the base layer or the covering layer. Generally, polyimide is used as the base layer, and solder resist is used as the covering layer.

Incidentally, since the circuit element to be mounted on the flexible wiring member generates heat by driving the actuator, as in an ink-jet printer head described in Japanese Patent Application Laid-open No. 2007-83707 submitted by applicants of the present application, a damage due to transmission of the heat of the circuit toward the actuator is suppressed by arranging a heat releasing body in contact with the circuit element. In the ink-jet printer head described in Japanese Patent Application Laid-open No. 2007-83707, a recording head having an actuator is installed on a lower surface side of a bottom plate of a head holder, exposing nozzles to a lower surface side. The external signal source is installed on an upper surface side of the head holder, and the heat releasing body is arranged inside the head holder.

Therefore, a flexible wiring member, which is drawn from the actuator, has a lower surface of one end portion overlapping with an upper surface of the actuator. The wiring member has the other end portion rising up along an inner wall on a side surface of the head holder, and is drawn to be extended toward the external signal source. Since the circuit element is mounted on an upper surface of the flexible wiring member, the heat releasing body is arranged at an upper surface side of the flexible wiring member, and is in a close contact with the circuit element.

When the flexible wiring member is drawn around as in the ink-jet printer head described in Japanese Patent Application Laid-open No. 2007-83707, an output electrode for connecting to the actuator is formed on the lower surface of the flexible wiring member, and a connecting electrode for mounting the circuit element is formed on the upper surface. Therefore, in the abovementioned one-side wired flexible wiring member, one of the output electrode and the connecting electrode is formed by exposing the electroconductive wire by partially removing the base layer, and the remaining of the output electrode and the connecting electrode is formed by exposing the electroconductive wire by partially removing the covering layer.

However, although polyimide which is used for the base layer has a superior durability, it is not easy to process. Therefore, a high level technology is necessary for forming the electrodes with a fine pitch by removing polyimide, and a manufacturing cost becomes high.

SUMMARY OF THE INVENTION

The present invention has been made to solve the abovementioned problems, and an object of the present invention is to realize an electronic apparatus which is capable of releasing the heat sufficiently by bringing the circuit element which is mounted, in a contact with the heat releasing body, while suppressing a rise in the manufacturing cost of the flexible wiring member which connects the electrical load and the external signal source.

According to a first aspect of the present invention, there is provided an electronic apparatus including an electrical load; and a flexible wiring member, on which a circuit element is mounted, and which transmits by a plurality of electroconductive wires a signal from an external signal source to the electrical load via the circuit element, and the flexible wiring member is a band-shaped member, and has, on one surface of the flexible wiring member, an output electrode via which the wiring member is connected to the electrical load and which is formed at an area facing the electrical load, and a connecting electrode on which the circuit element is mounted and which is formed in a drawn area, the electroconductive wires from the electrical load being drawn in the drawn area; an opening is formed in the drawn area; and the flexible wiring member is folded such that the circuit element is exposed through the opening to a side of the other surface of the flexible wiring member.

According to the first aspect of the present invention, the output electrode via which the wiring member is connected to the electrical load and the connecting electrode on which the circuit element is mounted are formed on one surface of the flexible wiring member. In other words, since the output electrode and the connecting electrode are formed on the same surface of the flexible wiring member, it is possible to process a surface, of the flexible wiring member, which is easier to process at one step. Therefore, it is possible to suppress a rise in a manufacturing cost of the flexible wiring member.

Moreover, the flexible wiring member is folded such that the circuit element mounted on the connecting electrode of the one surface is exposed through the opening formed in the flexible wiring member to a side of the other surface of the flexible wiring member. Accordingly, it is possible to arrange easily the circuit element on an opposite side of the electrical load with respect to the flexible wiring member, without any processes such as cutting and adhering the electroconductive wiring member which electrically connects the electrical load and the circuit element.

In the electronic apparatus of the present invention, the circuit element exposed through the opening may be in a close contact with a heat releasing body which is arranged on the side of the other surface of the flexible wiring member. In this case, it is possible to release efficiently the heat of the circuit element to the heat releasing body, and to suppress the heat of the circuit element from being transferred to the electrical load.

In the electronic apparatus of the present invention, the flexible wiring member may have a base layer, a plurality of electroconductive wires arranged on the base layer and a covering layer which insulates and covers the electroconductive wires; and a surface, of the flexible wiring member, on which the covering layer is formed, may be the one surface of the flexible wiring member. Moreover, the base layer may be formed of polyimide and the covering layer may be formed of solder resist. Solder resist is easier to process than polyimide. Accordingly, it is easy to form the electrodes highly densely on the covering layer of solder resist, and it is possible to process highly accurately while suppressing the manufacturing cost.

The electronic apparatus of the present invention may further include a jetting head which jets liquid droplets of a liquid, and the electrical load may be an actuator which applies a jetting pressure to the liquid inside the jetting head; and the actuator may be driven to jet the liquid droplets from the jetting head onto a recording medium.

In the electronic apparatus of the present invention, the heat releasing body may be arranged at a position at which the heat releasing body does not overlap with the electrical load, in a plan view from the side of the other surface of the flexible wiring member. In this case, the heat of the circuit element and the heat transmitted from the circuit element to the heat releasing body are hardly transmitted to the electrical load, and it is possible to reduce substantially an adverse effect due to heat on the electrical load.

In the electronic apparatus of the present invention, the flexible wiring member may have a fold portion on which the circuit element is mounted, and a base in which the opening is formed and which is positioned nearer to the output electrode than the fold portion before the fold portion is folded; and the circuit element may be exposed through the opening to the side of the other surface by folding the fold portion toward the base such that a portion, of the one surface, corresponding to the fold portion and another portion, of the one surface, corresponding to the base face with each other. In this case, it is possible to arrange easily the circuit element on an opposite side of the electrical load with respect to the flexible wiring member without cutting the electroconductive wire drawn from the electrical load.

In the electronic apparatus of the present invention, a notch may be cut in the flexible wiring member to form a tongue portion which has a tip end located near to the output electrode and a base end located far from the output electrode, and which extends across the base or across the fold portion and the base; the opening may be formed in the base by folding the tongue portion toward the fold portion before the fold portion is folded such that a portion of the other surface, corresponding to the tongue portion and the portion of the other surface, corresponding to the fold portion before the fold portion face with each other; and an input electrode via which the flexible wiring member is connected to the external signal source may be formed on the tip end of the tongue portion. In this case, it is not necessary to form an opening in advance in the flexible wiring member. Moreover, since the input electrode is formed at the tip end of the tongue portion, it is possible to arrange the input electrode at a position far from the output electrode by folding the tongue portion. Accordingly, it is possible to connect easily an output electrode of the external signal source and the input electrode of the flexible wiring member.

In the electronic apparatus of the present invention, an input electroconductive wire which connects the input electrode and the circuit element may be formed on the tongue portion; and an output electroconductive wire which connects the circuit element and the output electrode may be wired to bypass the notch forming the tongue portion. By wiring in such manner, even when the tongue portion is formed by cutting a notch, it is possible to secure easily an electrical conduction between the input electrode and the circuit element, and an electrical conduction between the circuit element and the electrical load.

In the electronic apparatus of the present invention, an input electrode via which the flexible wiring member is connected to the external signal source may be formed on the flexible wiring member at an end portion far from the output electrode. In this case, since the input electrode is formed on the end portion far from the output electrode on the flexible wiring member, after the fold portion is folded with respect to the base such that a portion, of the one surface, corresponding to the hold portion and a portion, of the one surface, corresponding to the base face with each other, the input electrode is provided at a midway portion in a plan view of the flexible wiring member which extends from the electrical load up to the external signal source. In other words, it is possible to connect the output electrode of the external signal source and the flexible wiring member at the midway portion in a plan view of the flexible wiring member.

In the electronic apparatus of the present invention, a notch may be cut in the flexible wiring member before the fold portion is folded to form a tongue portion having a base end located near to the output electrode and a tip end located far from the output electrode, and which extends across the fold portion, or across the fold portion and the base; an input electrode via which the flexible wiring member is connected to the external signal source may be formed on the tip end of the tongue portion; and a portion, of the fold portion, which is different from the tongue portion may be folded toward the base. In this case, by folding the portion of the fold portion different from the tongue portion toward the base, the tongue portion is protruded toward a far side from the output electrode. Since the input electrode is formed on the tip end of the tongue portion, it is possible to arrange the input electrode at a position far from the output electrode. Accordingly, it is possible to connect easily the output electrode of the external signal source and the input electrode of the flexible wiring member.

In the electronic apparatus of the present invention, an input electroconductive wire which connects the input electrode and the circuit element may be wired to bypass the notch forming the tongue portion. By wiring in such manner, even when the tongue portion is formed by cutting a notch, it is possible to secure easily an electrical conduction between the input electrode and the circuit element, and an electrical conduction between the circuit element and the electrical load.

In the electronic apparatus of the present invention, an output terminal may be formed on a surface, of the circuit element, facing the one surface; an input terminal may be formed on the other surface, of the circuit element, opposite to the surface on which the output terminal is formed; the opening may be formed to have an area smaller than an area of the circuit element in a plan view; an input electroconductive wire may be wired to connect a periphery of the opening and the input electrode; and the fold portion may be folded to make the input electroconductive wire and the input terminal of the circuit element face with each other at the periphery of the opening and to be connected electrically with each other. By folding in such manner, a central portion of the other surface of the circuit element is exposed through the opening, and the input terminal of the circuit element makes a contact with the input electroconductive wire which is wired to the periphery of the opening. Moreover, by electrically connecting the input terminal of the circuit element and the input electroconductive wire which is wired to the periphery of the opening, it is possible to input a driving signal from the input electrode to the circuit element. In other words, it is possible to secure an electrical conduction between the input electrode and the circuit element, and an electrical conduction between the circuit element and the electrical load.

According to a second aspect of the present invention, there is provided an electronic apparatus including an electrical load; and a flexible wiring member on which a circuit element is mounted, and which transmits by a plurality of electroconductive wires a signal from an external signal source to the electrical load via the circuit element, and the flexible wiring member is a band-shaped member, and has, on one surface thereof, an output electrode via which the flexible wiring member is connected to the electrical load and which is formed at an area facing the electrical load; the flexible wiring member has a drawing area in which the electroconductive wires from the electrical load are drawn, and a connecting electrode on which the circuit element is mounted; and the flexible wiring member is folded such that the circuit element is exposed to a side of the other surface of the flexible wiring member, and that the circuit element does not overlap with the electrical load in a direction of thickness of the flexible wiring member.

According to the second aspect of the present invention, the output electrode via which the flexible wiring member is connected to the electrical load, and the connecting electrode on which the circuit element is mounted are formed on the one surface of the flexible wiring member. In other words, since the output electrode and the connecting electrode are formed on the same surface of the flexible wiring member, it is possible to process a surface, of the flexible wiring member, which is easier to process at one step. Therefore, it is possible to suppress a rise in a manufacturing cost of the flexible wiring member.

Only by folding the flexible wiring member, it is possible to arrange easily the circuit element on an opposite side of the electrical load, with respect to the flexible wiring member without cutting the electroconductive wire between the electrical load and the circuit element. Further, since the circuit element is folded such that the circuit element does not overlap with the electrical load in a direction of thickness of the flexible wiring member, it is possible to suppress the heat of the circuit element from being transmitted to the electrical load.

In the electronic apparatus of the present invention, the exposed circuit element may be in a close contact with a heat releasing body which is arranged on the side of the other surface of the flexible wiring member. In this case, it is possible to release efficiently the heat of the circuit element to the heat releasing body, and to suppress the heat of the circuit element from being transmitted to the electrical load.

In the electronic apparatus of the present invention, the flexible wiring member may have a base layer, a plurality of electroconductive wires arranged on the base layer, and a covering layer which covers and insulates the electroconductive wires; and a surface, of the flexible wiring member, on which the covering layer is formed may be the one surface. Moreover, the base layer may be formed of polyimide; and the covering layer may be formed of a solder resist. Solder resist is easier to process than polyimide. Accordingly, it is easy to form the electrodes highly densely on the covering surface of solder resist, and it is possible to process highly accurately while suppressing the manufacturing cost.

The electronic apparatus of the present invention may further include a jetting head which jets liquid droplets of a liquid, and the electrical load may be an actuator which applies a jetting pressure to the liquid inside the jetting head; and the actuator may be driven to jet the liquid droplets from the jetting head onto a recording medium.

In the electronic apparatus of the present invention, the heat releasing body may be arranged at a position at which the heat releasing body does not overlap with the electrical load, in a plan view from a side of the other surface of the flexible wiring member. In this case, the heat of the circuit element and the heat transmitted from the circuit element to the heat releasing body are hardly transmitted to the electrical load, and it is possible to reduce substantially an adverse effect due to heat on the electrical load.

In the electronic apparatus of the present invention, the flexible wiring member may have a fold portion on which the circuit element is mounted, and a base which is positioned nearer to the output electrode than the fold portion; a notch may be cut in the flexible wiring member to form a tongue portion which has a tip end located near to the output electrode and a base end located far from the output electrode, and which extends across the base, or across the fold portion and the base; an input electrode via which the flexible wiring member is connected to the external signal source may be formed on the tip end of the tongue portion; the tongue portion may be folded toward the fold portion before the fold portion is folded such that a portion, of the one surface, corresponding to the tongue portion and a portion, of the one surface, corresponding to the fold portion face with each other and the fold portion may be folded toward the base such that a portion, of the other surface, corresponding to the fold portion and a portion, of the other surface, corresponding to the base face with each other to thereby expose the circuit element to the side of the other surface. In this case, since the input electrode is formed at the tip end of the tongue portion, it is possible to arrange the input electrode at a position far from the output electrode by folding the tongue portion such that a portion, of the one surface, corresponding to the tongue portion and a portion, of the one surface, corresponding to the fold portion before the fold portion is folded face with each other. Accordingly, it is possible to connect easily the output electrode of the external signal source and the input electrode of the flexible wiring member.

In the electronic apparatus of the present invention, an input electroconductive wire which connects the input electrode and the circuit element may be formed on the tongue portion; and an output electroconductive wire which connects the circuit element and the output electrode may be wired to bypass the notch forming the tongue portion. By wiring in such manner, even when the tongue portion is formed by cutting a notch, it is possible to secure easily an electrical conduction between the input electrode and the circuit element, and an electrical conduction between the circuit element and the electrical load.

The electronic apparatus of the present invention may further include another flexible wiring member which connects the input electrode and the external signal source, and the input electrode may be formed on the flexible wiring member at an end portion located far from the output electrode; the input electrode may be connected to the another flexible wiring member; a through hole may be formed through the another flexible wiring member; and the another flexible wiring member may be overlapped to face the one surface of the fold portion after the fold portion is folded to expose the circuit element through the through hole. In this case, since the through hole is formed in the another flexible wiring member which connects the input electrode and the external signal source, it is possible to expose the circuit element through the through hole. Moreover, since the input electrode is formed on the end portion far from the output electrode on the flexible wiring member, after the fold portion is folded, the input electrode is provided at a midway portion in a plan view of the flexible wiring member which extends from the electrical load up to the external signal source. In other words, it is possible to connect the output electrode of the external signal source and the flexible wiring member at the midway portion in a plan view of the flexible wiring member.

In the electronic apparatus of the present invention, the flexible wiring member may have a fold portion on which the circuit element is mounted, and a base which is positioned nearer to the output electrode than the fold portion; a notch may be cut in the flexible wiring member to form a tongue portion which has a tip end located far from the output electrode and a base end located near to the output electrode, and which extends across the fold portion, or across the fold portion and the base; an input electrode via which the flexible wiring member is connected to the external signal source may be formed on the tip end of the tongue portion; the fold portion may be folded toward the base such that a portion, of the other surface, corresponding to the fold portion and a portion, of the other surface, corresponding to the base face with each other to make the tongue portion project from the base and to expose the circuit element to a side of the other surface. In this case, by folding the fold portion toward the base such that a portion, of the other surface, corresponding to the fold portion and a portion, of the other surface, corresponding to the base face with each other, the tongue portion is protruded from the base. Moreover, since the input electrode via which the flexible wiring member is connected to the external signal source is formed on the tip end of the tongue portion, it is possible to arrange the input electrode at a position far from the output electrode. Accordingly, it is possible to connect easily the input terminal of the flexible wiring member and the output electrode of the external signal source.

In the electronic apparatus of the present invention, an input electroconductive wire which connects the input electrode and the circuit element may be formed on the tongue portion; and the input electroconductive wire may be wired to bypass the notch forming the tongue portion. By wiring in such manner, even when the tongue portion is formed by cutting a notch, it is possible to secure easily an electrical conduction between the input electrode and the circuit element, and an electrical conduction between the circuit element and the electrical load.

According to a third aspect of the present invention, there is provided a flexible wiring member in a form of a band including a base layer; an electroconductive wire which is wired on one surface of the base layer; a covering layer which is formed on the base layer and which covers the electroconductive wire; an output electrode which is formed on the covering layer; and a circuit element which is mounted on the covering layer, and the flexible wiring member is folded and fixed such that the circuit element is exposed to a side opposite to the output electrode with respect to the flexible wiring member and that the circuit element does not overlap with the output electrode in a thickness direction of the flexible wiring member.

According to the third aspect of the present invention, it is possible to arrange the circuit element at an opposite side of the output electrode with respect to the flexible wiring member, without processing both surfaces of the flexible wiring member.

In the flexible wiring member of the present invention, an area, of the flexible wiring member, on which the circuit element is mounted may be folded. Moreover, the base layer may be formed of polyimide and the covering layer may be formed of solder resist. Solder resist is easier to process than polyimide. Accordingly, it is easy to form the electrodes highly densely on the covering layer of the solder resist, and it is possible to process highly accurately while suppressing the manufacturing cost.

DETAILED DESCRIPTION OF THE PREFERRED EMBODIMENTS

Figure 1:
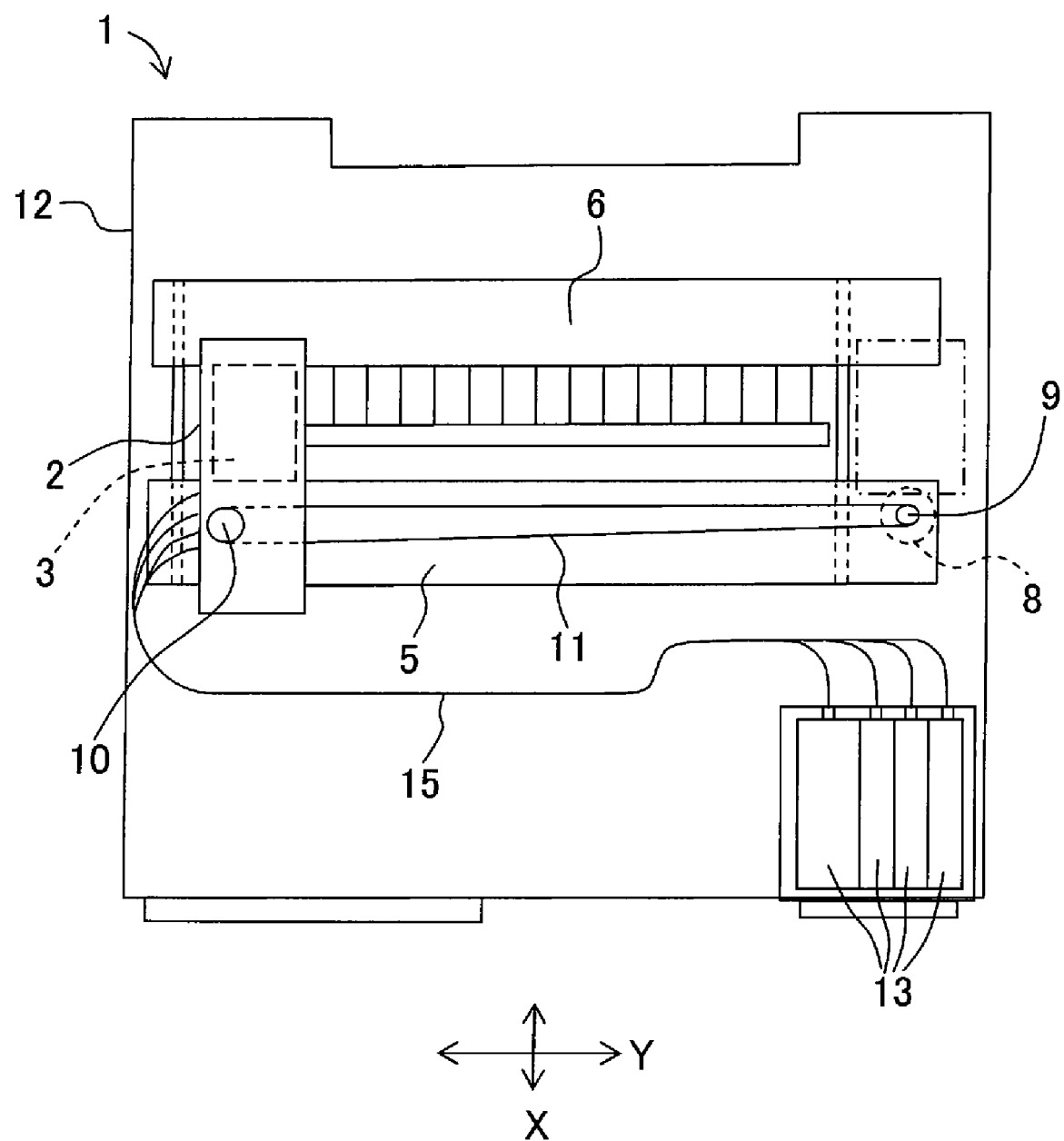
FIG. 1 is a schematic plan view of a jetting apparatus to which the present invention is applied.

Embodiments of the present invention will be described below by using the diagrams. FIG. 1 is a schematic plan view of a jetting apparatus which jets an ink. This apparatus is an example of a liquid jetting apparatus as an electronic apparatus of the present invention. A jetting apparatus 1 may be applied to a printer apparatus which has only a printer function, or may be applied to a multi-function printer which has a plurality of functions such as a facsimile function and a copy function. In the following description, a direction of jetting the ink from a nozzle 7 (refer to FIG. 4) is described as a downward direction or a lower side, and a direction opposite to the downward direction is described as an upward direction or an upper side.

As shown in FIG. 1, in the jetting apparatus 1, a carriage 2 is provided, and a jetting head 3 provided with nozzles 7 is mounted on the carriage 2 with the nozzles 7 exposed from a lower surface of the carriage 2. A first guide member 5 and a second guide member 6 are members on which the carriage 2 is mounted, and which support the carriage 2 so that the carriage 2 can move in a main scanning direction (Y-axis direction). The carriage 2 reciprocates along the Y-axis direction by a timing belt 11 which is put around a driven pulley and a drive pulley 9 coupled with a carriage motor 8. A paper on which the ink is to be jetted is transported in a secondary scanning direction (X-axis direction) which is orthogonal to the main scanning direction (Y-axis direction), below the carriage 2.

A replaceable ink cartridge 13 is installed inside an apparatus main body 12, and in accordance with the number of ink colors, four ink cartridges 13 for a black ink, a cyan ink, a magenta ink, and a yellow ink are provided. The ink in each ink cartridge 13 is supplied independently to the carriage 2 via a supply tube. A flexible ink supply tube 15 made of a resin material is used as the supply tube.

Figure 2:
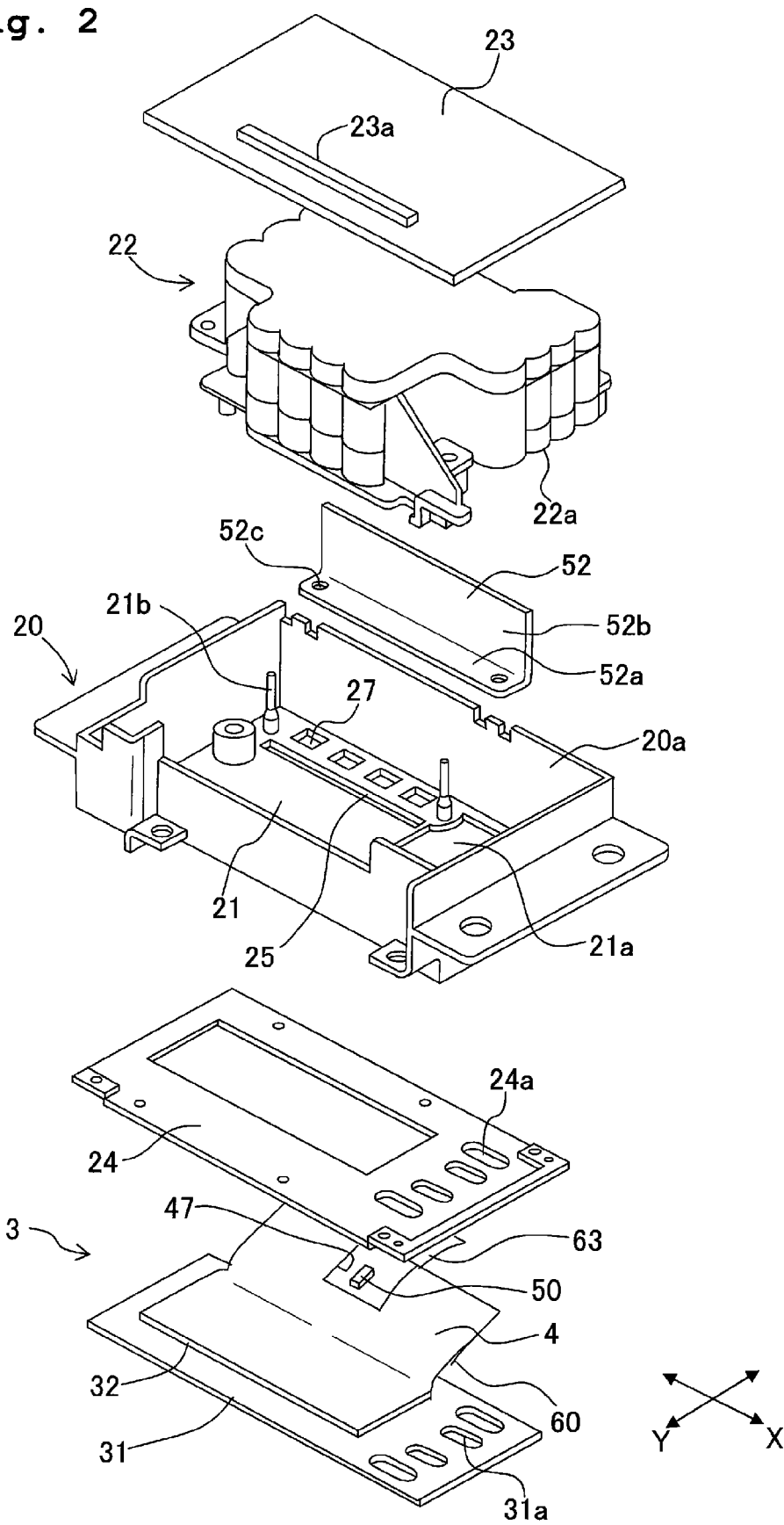
FIG. 2 is an exploded perspective view of a carriage.

The carriage 2, as shown in FIG. 2, is provided with a head holder 20 which is substantially box shaped with an upper surface open. The jetting head 3 is fixed on a side of a lower surface of a bottom plate 21 of the head holder 20 via a reinforcing frame 24. For modifying an unevenness at the side of the lower surface of the head holder 20, a front frame 28 is stuck on a side of a lower surface of the reinforcing frame 24 to surround the jetting head 3 (refer to FIG. 3).

An ink storage portion 22 which temporarily stores the ink supplied from the ink cartridge 13, and a circuit board 23 are mounted on a side of an upper surface of the bottom plate 21 of the head holder 20. The circuit board 23 receives a driving signal from a control circuit 100 (an external signal source) which is installed in the apparatus main body 12 via a flexible wiring cable, and supplies a driving signal to an actuator 32 of the jetting head 3 via a flexible wiring member 4.

In the first embodiment, the flexible wiring member 4 is connected to the circuit board 23 via an auxiliary wiring member 51 (another flexible wiring member). In other words, the flexible wiring member 4 which is connected to the actuator 32 and on which a circuit element 50 is mounted, and the flexible auxiliary wiring member 51 which is connected to the circuit board 23, are connected with each other in a direction in which an electroconductive wire extends, between the actuator 32 and the circuit board 23. The flexible wiring member 4 and the auxiliary wiring member 51 are connected at a position toward a lower end of a side portion 52b of a heat releasing body 52.

For the flexible wiring member 4, a chip on film (COF), in which it is possible to design a wiring pattern freely, and on which the circuit element 50 is mounted, is use. For the auxiliary wiring member 51, a cable such as a flexible printed cable (FPC) which is cheaper than the chip on film, and in which a degree of freedom of wire designing is high, or a general purpose flexible flat cable (FFC), in which conductive wires are wired in parallel, is suitable. By connecting the two wiring members in such manner, it is possible to reduce an amount of usage of the expensive chip on film, and to reduce a component cost. As a matter of course, the actuator 32 and the circuit board 23 may be connected by three or more wiring members, or may be connected only by the chip on film (COF).

An opening 21a is formed through the bottom plate 21 of the head holder 20. At an inner side of the opening 21a, an ink outflow port 22a of the ink storage portion 22, and an ink inflow port 31a of the jetting head 3 are connected via a connecting hole 24a of the reinforcing frame 24. Ink is supplied independently for each color, from the ink storage portion 22 to the jetting head 3.

A slit 25, through which the flexible wiring member 4 is inserted, is formed through the bottom plate 21, at a position toward one side wall 20a of the head holder 20. Moreover, a plurality of through holes 27 for pouring an adhesive 26 for fixing the jetting head 3 on a side of the lower surface of the bottom plate 21 is formed in the bottom plate 21, along both side walls namely, the side wall 20a and a side wall facing the side wall 20a. Moreover, two pins 21b for positioning and fixing a heat releasing body 52 which will be described later are erected on the bottom plate 21.

Figure 4:
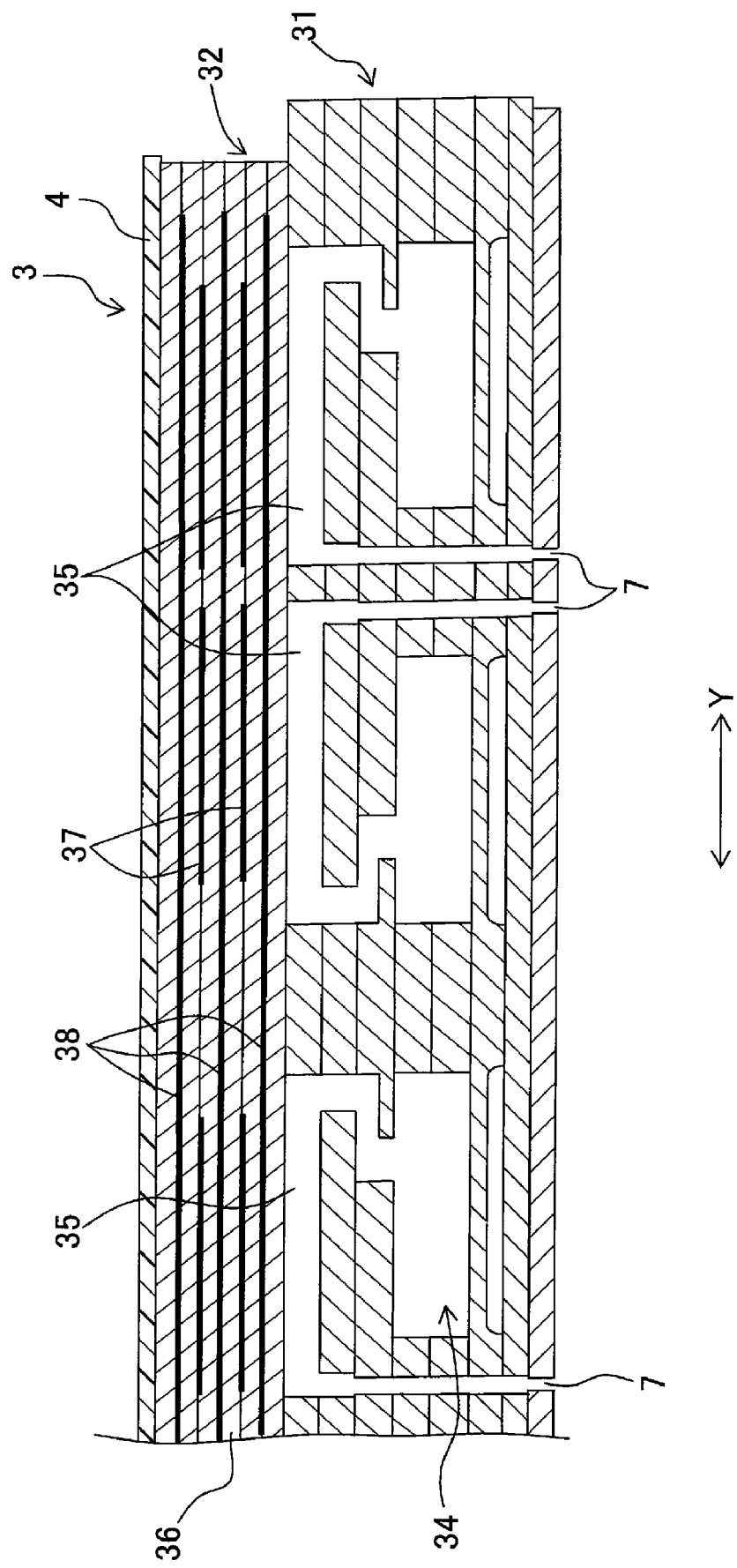
FIG. 4 is a vertical cross-sectional view of a jetting head cut along the Y direction.

The jetting head 3, similarly as a recording head described in U.S. Pat. No. 7,294,952 (corresponds to Japanese Patent Application Laid-open No. 2005-322850), is formed by stacking a cavity portion 31, which opens nozzles 7 on a side of a lower surface and has a pressure chamber 35 on a side of an upper surface, a plate type actuator 32, and a flexible wiring member 4, as shown in FIG. 4. The disclosure of U.S. Pat. No. 7,294,952 is incorporated herein by reference.

The cavity portion 31 is formed by stacking a plurality of thin plates, including a nozzle plate in which the plurality of nozzles 7 is formed at a lowermost surface, and a cavity plate which is provided with a plurality of pressure chambers 35 communicating with the nozzles 7 at an uppermost surface. At an interior of the cavity portion 31, a series of ink supply channels is formed such that the ink introduced from the ink storage portion 22 into the ink inflow port 31a of the cavity portion 31 is distributed to the plurality of pressure chambers 35 via a manifold 34, and that each of the nozzles 7 is filled with the ink. The plurality of nozzles 7 and the plurality of pressure chambers 35 each of which communicates with one of the nozzles 7 are formed in rows in X direction in a plan view, and further arranged in Y direction for each color although it is not shown in the diagram.

The actuator 32, as shown in FIG. 4, is formed by a plurality of ceramics layers 36 which are flat shaped, and have a size to cover all pressure chambers 35, and which are stacked in a direction orthogonal to a direction of flatness, and a plurality of electrodes which are arranged between the ceramics layers 36.

Figure 5:
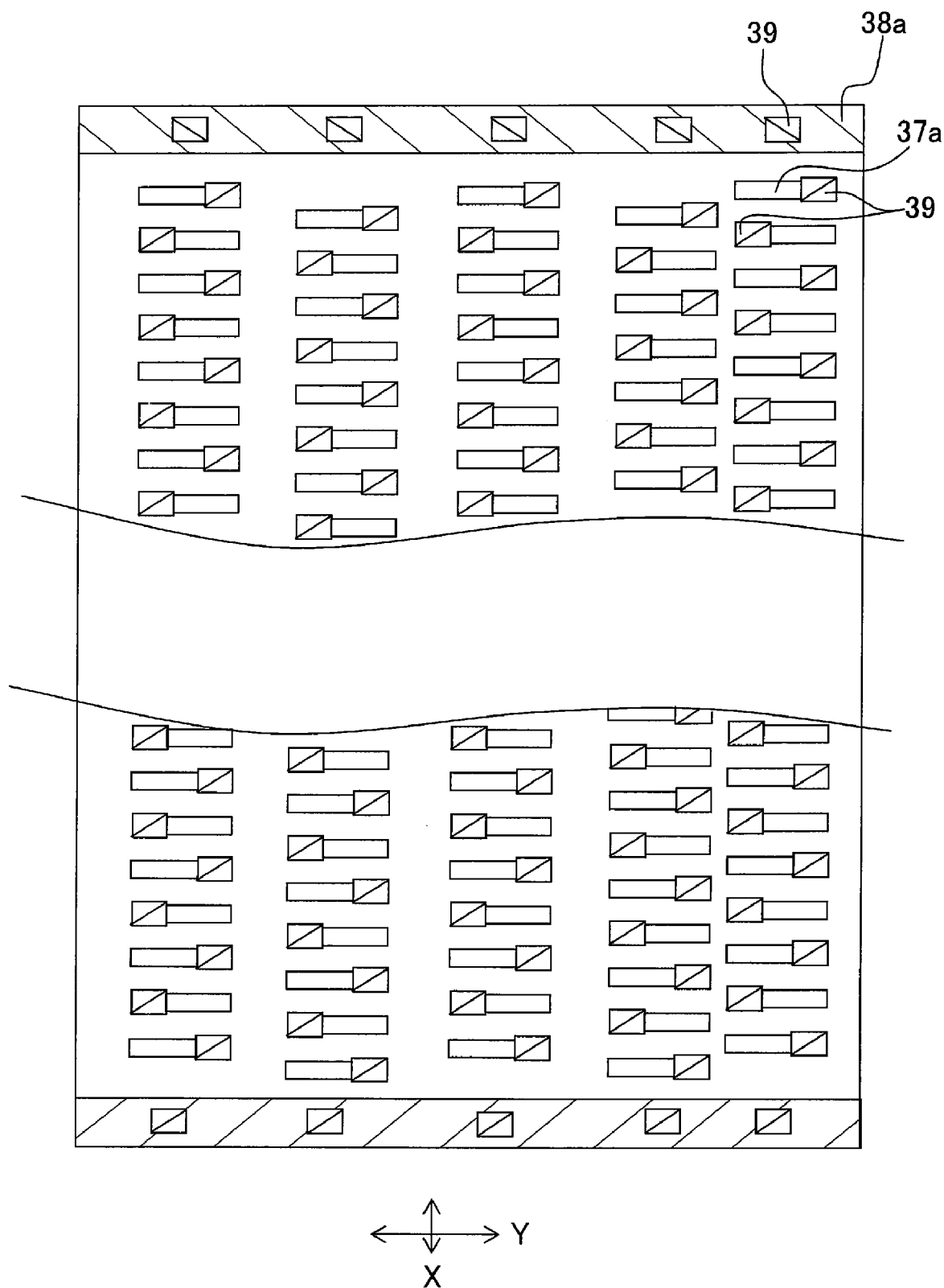
FIG. 5 is a plan view of an actuator.

The electrodes include individual electrodes 37 each of which is formed corresponding to one of the pressure chambers 35, and common electrodes 38 each of which is formed to cover the plurality of pressure chambers 35. The individual electrodes 37 and the common electrodes 38 are arranged alternately between the ceramics layers 36. A plurality of surface individual electrodes 37a and surface common electrodes 38a are formed on an uppermost surface of the actuator 32 as shown in FIG. 5. The surface individual electrodes 37a and the surface common electrodes 38a correspond to the plurality of individual electrodes 37 and common electrodes 38 respectively, and are electrically connected via through holes.

The surface individual electrodes 37a and the surface common electrodes 38a are Ag—Pd electrodes. Each of the surface individual electrodes 37a has a long and slender shape corresponding to one of the pressure chambers 35 and one of the individual electrodes 37, and the surface common electrodes 38a are provided in the form of a band on both ends in the X direction of the actuator 32. Connecting terminals 39 via which the flexible wiring member 4 is connected to the actuator 32 are provided on the surface individual electrodes 37a and the surface common electrodes 38a. Each of the connecting terminals 39 on the surface individual electrodes 37a is formed toward an end portion in the Y direction of one of the surface individual electrodes 37a, and a row of connecting terminals 39 is formed in a zigzag form in the X direction (refer to FIG. 5).

The connecting terminals 39 are formed of silver. Moreover, each of the connecting terminals 39 and one of output electrodes 44 which will be described later, of the flexible wiring member 4 are connected by joining via an electroconductive brazing filler material such as solder. Since each of the surface individual electrodes 37a corresponds to one of the pressure chambers 35 (nozzles 7), the surface individual electrodes 37a extend in the form of a row in the X direction for each ink color, and are arranged in the Y direction. There are five rows in the Y direction of the surface individual electrodes 37a in FIG. 5. This is because there are two rows of the nozzles 7, two rows of the pressure chambers 35, two rows of the individual electrodes 37, and two rows of the surface individual electrodes 37a for a black ink which is used frequently.

In the actuator 32 provided with the electrodes in such manner, a selective drive voltage from the circuit element 50 which will be described later is applied between the individual electrodes 37 and the common electrodes 38, via the flexible wiring member 4. As the selective drive voltage is applied, a portion of the ceramics layer 36 sandwiched between each of the individual electrodes 37 and one of the common electrodes 38 becomes a drive portion (active portion) and is elongated, and a pressure is applied to the ink inside the pressure chamber 35 corresponding to the drive portion, and the ink is jetted from the nozzle 7.

The flexible wiring member 4 which will be described later in detail, as shown in FIG. 6 and FIG. 7, has an input electrode 46 which is connected to the auxiliary wiring member 51, and is provided with an input electroconductive wire 49 which connects the input electrode 46 and the circuit element 50, and an output electroconductive wire 48 which connects the actuator 32 and the circuit element 50. At one end portion of the flexible wiring member 4, the output electrodes 44 via which the flexible wiring member 4 is connected to the surface common electrodes 38a and the surface individual electrodes 37a on the uppermost surface of the actuator 32 are formed. The circuit element 50 for driving the actuator 32 is mounted on the flexible wiring member 4 at an area near the other end portion of the flexible wiring member 4. The circuit element 50 converts a driving signal serially transmitted from the circuit board 23 to a parallel signal corresponding to the individual electrodes 37, and is output to the actuator 32 from the output electrodes 44.

Figure 3:
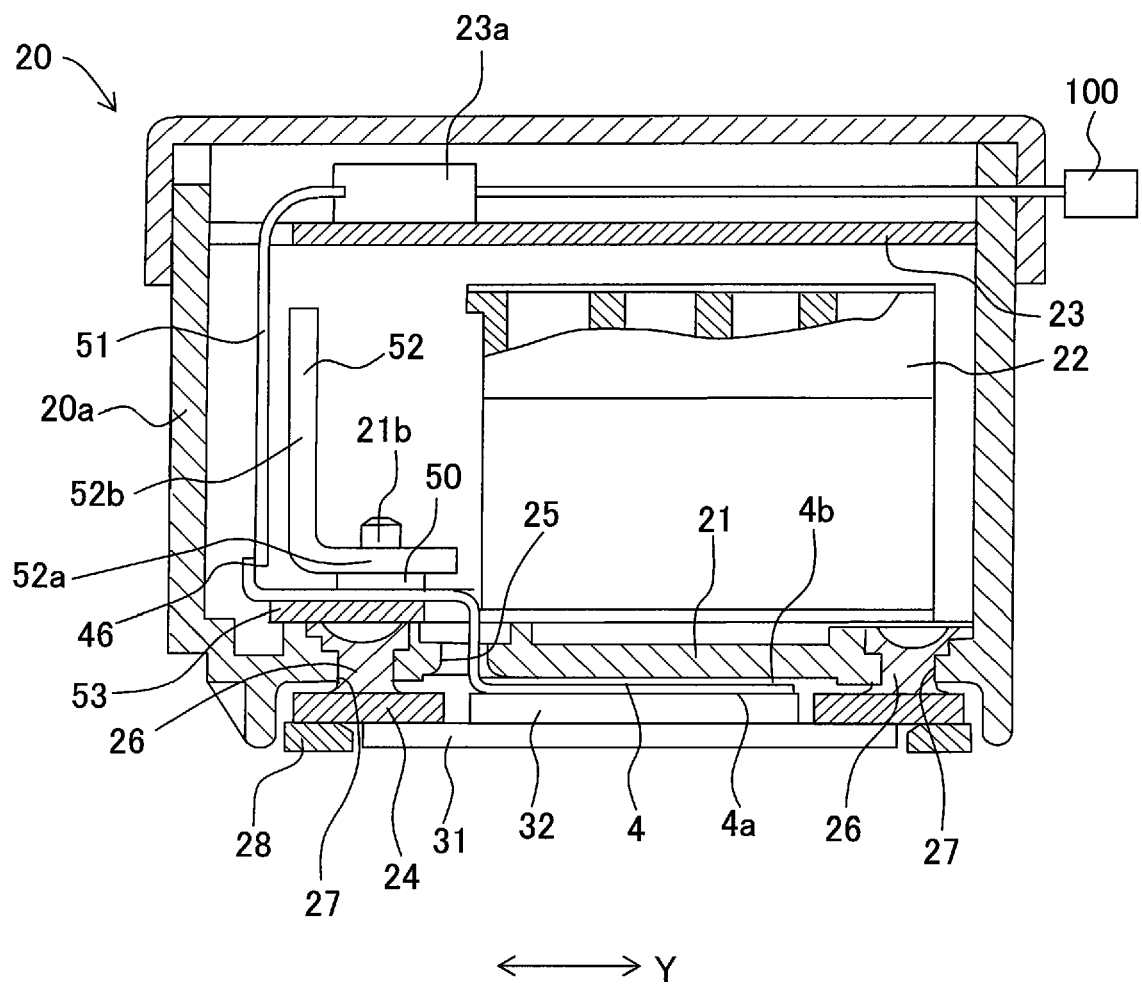
FIG. 3 is a vertical cross-sectional view of a head holder cut along a Y direction.

As shown in FIG. 3, the input electrode 46 of the flexible wiring member 4, and the auxiliary wiring member 51 which is connected to the input electrode 46 are drawn from a connecting position with the actuator 32, and inserted through the slit 25 from the side of the lower surface of the bottom plate 21 to the side of the upper surface of the bottom plate 21. Further, the flexible wiring member 4 and the auxiliary wiring member 51 are drawn in parallel to the upper surface of the bottom plate 21 toward the side wall 20a, and further extend upward along the side wall 20a.

The circuit element 50 described above is arranged to be exposed on the side of the upper surface of the flexible wiring member 4, in an area, of the flexible wiring member 4, which is parallel to the bottom plate 21. The circuit element 50, at the time of recording, generates heat because the circuit element 50 outputs a driving signal so that the ink is jetted from the nozzles 7 at a high frequency. Therefore, for releasing the heat of the circuit element 50, the heat releasing body 52 made of a metallic material is provided to be in close contact with the circuit element 50.

As the heat releasing body 52, a metallic member of a metal such as aluminum is used. The heat releasing body 52 has a bottom portion 52a which is substantially parallel to the bottom plate 21, and which is in close contact with the circuit element 50, and a side portion 52b which is substantially parallel to the side wall 20a of the head holder 20, and which guides the flexible wiring member 4 toward the circuit board 23, and is formed to have an L shape in a side view. However, the shape of the heat releasing body 52 is not restricted to such shape. The heat releasing body 52 is fixed to the head holder 20 by inserting the pin 21b of the bottom plate 21 through a fixing hole 52c formed in the bottom portion 52a of the heat releasing body 52, and fixing by a process such as welding.

Larger an area of a surface of the heat releasing body 52, higher is a heat releasing effect, and the heat releasing effect is further improved by securing a wide space for heat releasing around the heat releasing body 52. Consequently, the heat releasing body 52 is arranged at a space between the flexible wiring member 4 and the ink storage portion 22 (a side of a surface, of the flexible wiring member 4, opposite to a surface, of the flexible wiring member 4, which faces the side wall 20a), and the circuit element 50 exposed toward the side of the upper surface and the bottom portion 52a are in contact.

Figure 7A:
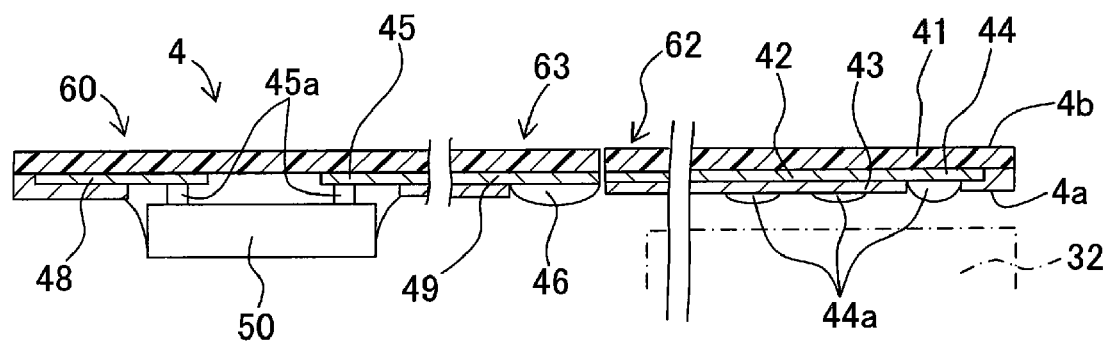
FIG. 7A is a cross-sectional view taken along a line VIIA-VIIA in FIG. 6A.
Figure 7B:
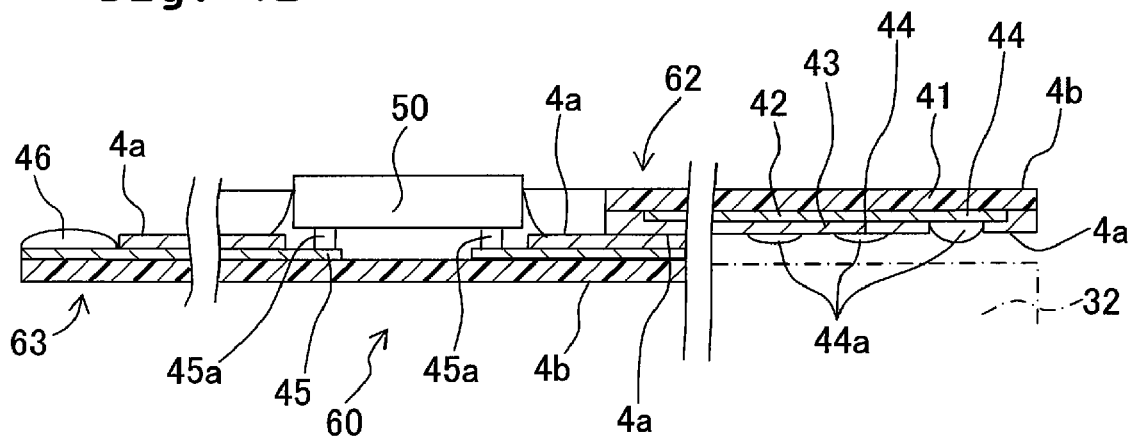
FIG. 7B is a cross-sectional view taken along a line VIIB-VIIB in FIG. 6B.

A structure of the flexible wiring member 4 will be described below in detail. The flexible wiring member 4 is a band-shaped member. As shown in FIG. 7A and FIG. 7B, a plurality of electroconductive wires 42 are wired on one surface of a band-shaped base layer 41 which is made of polyimide and which has a flexibility and an insulating property. The electroconductive wire 42 is a one-side wired wiring member which is covered to be insulated by a covering layer 43 made of solder resist. Out of the both surfaces of the flexible wiring member 4, a surface on a side at which the covering layer 43 is arranged is described as one surface 4a and a surface on a side at which the base layer 41 is arranged is described as the other surface 4b. The auxiliary wiring member 51 also, similarly as the flexible wiring member 4 has a stacked structure of a base layer, an electroconductive wire, and a covering layer.

As shown in FIG. 7A and FIG. 7B, in the flexible wiring member 4, the covering layer 43 is arranged to be directed toward a lower surface side (side of the actuator 32). The output electrodes 44 are formed by exposing the electroconductive wire 42 by partially removing the covering layer 43 at a position corresponding to the surface individual electrode 37a and the surface common electrode 38a of the actuator 32, at one end portion of the flexible wiring member 4. For each of the output electrodes 44, a bump 44a formed of an electroconductive brazing filler material such as solder is arranged on the side of the lower surface of the flexible wiring member 4. The output electrode 44 and the connecting terminal 39 are joined by inserting the electroconductive brazing filler material between the output electrode 44 and the connecting terminal 39, and it is possible to connect electrically.

Figure 6A:
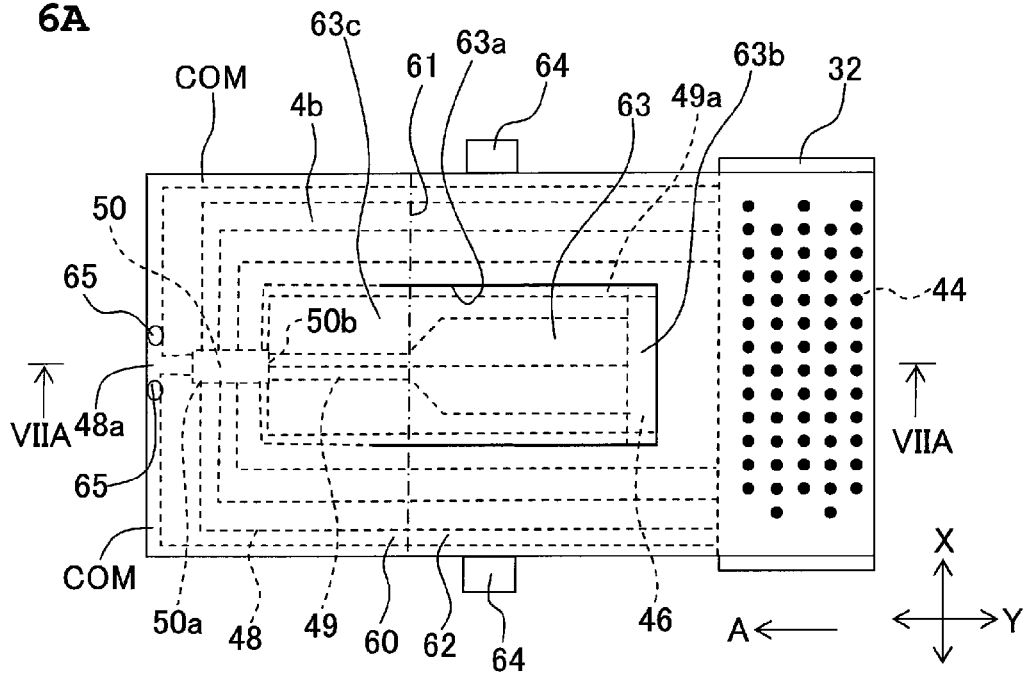
FIG. 6A is a plan view of a flexible wiring member of a first embodiment before being folded, as seen from a side of the other surface.

Moreover, the flexible wiring member 4, as shown in FIG. 6A, is drawn in direction A from one end portion at which the actuator 32 and the output electrode 44 are joined. An area of the flexible wiring member 4 drawn from the actuator 32 has a fold portion 60 which is positioned at a side far from the output electrode 44, and on which the circuit element 50 is mounted, and a base 62 which is positioned at a side nearer to the output electrode 44 than the fold portion 60 and on which a tongue portion 63 is provided. In the following description, a line which is formed when the fold portion 60 is folded toward the base 62, in other words, when the fold portion 60 is folded toward a direction opposite to the direction A in which the flexible wiring member 4 is drawn, is indicated as a broken line 61. Moreover, for the sake of convenience, to fold the fold portion 60 so as to form the broken line 61 will be called as to fold based on the broken line 61. Therefore, in an area of the flexible wiring member 4 which is drawn from the actuator 32, the fold portion 60 and the base 62 are defined by the broken line 61. Moreover, an opening 47 is formed by folding the tongue portion 63.

As shown in FIG. 7A, connecting electrodes 45 are formed on the flexible wiring member 4, on a side of the covering layer 43 for mounting the circuit element 50. The connecting electrodes 45, similarly as the output electrodes 44, are formed by exposing the electroconductive wire 42 by partially removing the covering layer 43, and gold bumps 45a are formed on the connecting electrodes 45. The connecting electrodes 45 include an electrode which is to be connected to an input terminal 50b, of the circuit element 50, to input a signal from a control circuit 100 (external signal source) of a main body, and an electrode which is to be connected to an output terminal 50a, of the circuit element 50, to output the signal to the actuator 32. In other words, a drive signal which is input from the auxiliary wiring member 51 to the input electrode 46 is input to the input terminal 50b of the circuit element 50 via the input electroconductive wire 49 and the connecting electrode 45, and a drive signal which is converted in the circuit element 50 and is output to the output terminal 50a is output from the output electrode 44 to the actuator 32 via the connecting electrode 45 and the output electroconductive wire 48.

Both the output electrode 44 and the connecting electrode 45 are formed at a side (lower surface side) of the one surface 4a. By folding the flexible wiring member 4 based on the broken line 61, the circuit element 50 mounted on the connecting electrode 45 is exposed toward the other surface 4b, which is the upper surface of the flexible wiring member 4, from the opening 47. The details will be described later. Accordingly, it is possible to connect directly the circuit element 50 and the heat releasing body 52 arranged on the side of the upper surface of the flexible wiring member 4.

Similarly as the output electrode 44 and the connecting electrode 45, the input electrode 46 via which the flexible wiring member 4 is connected to the auxiliary wiring member 51 is formed by exposing the electroconductive wire 42 by partially removing the covering layer 43.

As it has been described above, the driving signal which is serially transmitted is input to the circuit element 50, and the circuit element 50 converts the driving signal to a parallel signal, and outputs. Consequently, at least the number of the output electrodes 44, the output electroconductive wires 48, and the output terminals 50a of the circuit element 50 same as the total number of the individual electrodes 37 (same as the number of nozzles) and the common electrodes 38 is required, and the number of the input terminals 50b, the input electroconductive wires 49, and the input electrodes 46 may be less than these.

Figure 6B:
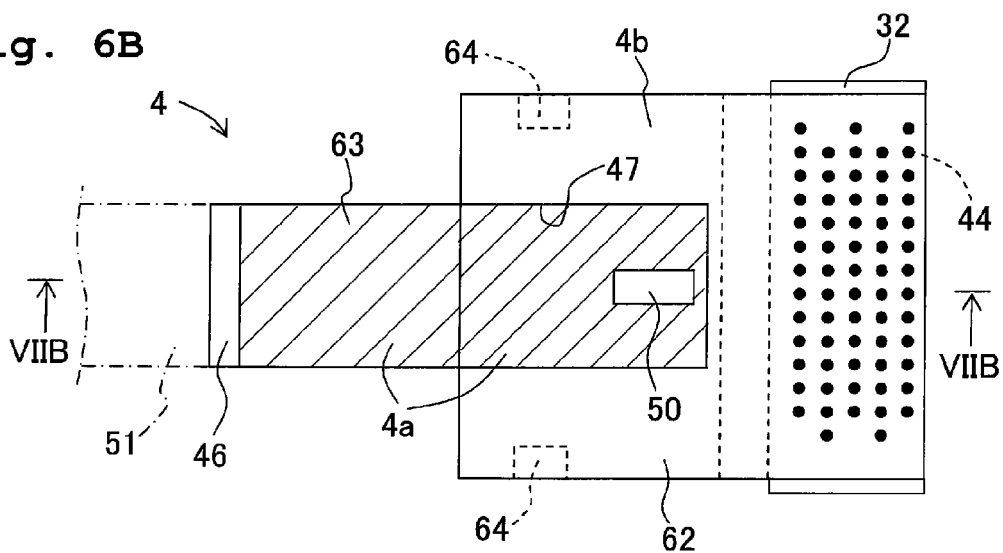
FIG. 6B is a plan view of the flexible wiring member of the first embodiment after being folded, as seen from a side of the other surface.
Figure 6C:
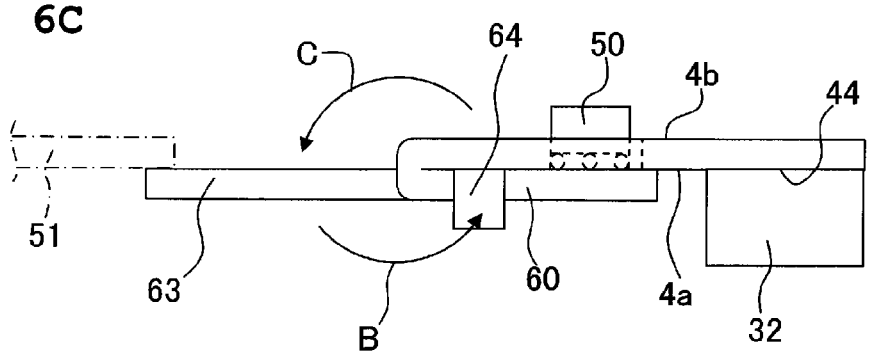
FIG. 6C is a schematic side view of the flexible wiring member of the first embodiment.

Next, a plurality of embodiments for exposing the circuit element 50 which is mounted on the one surface 4a of the flexible wiring member 4 by folding the fold portion 60, on a side of the other surface 4b will be described below. Firstly, a first embodiment will be described by using FIGS. 6A, 6B, and 6C. FIG. 6A is a plan view of the flexible wiring member 4 before being folded, as seen from the side of the other surface 4b, FIG. 6B is a plan view of the flexible wiring member 4 after being folded, as seen from the side of the other surface 4b, and for the sake of convenience, hatching is carried out on a portion at which the one surface 4a can be seen. FIG. 6C is a schematic side view of the flexible wiring member, and shows schematically a dimension in a direction of thickness in an emphasized manner. Diagrams showing the other embodiments which will be described below are similar to FIG. 6A, FIG. 6B, and FIG. 6C.

On the flexible wiring member 4 before being folded, as shown in FIG. 6A, the tongue portion 63 is formed on the base 62 which is defined by the broken line 61, in an area of the flexible wiring member drawn from the actuator 32. Since the tongue portion 63 is tongue shaped having a tip end 63b located near to the output electrode 44 and a base end 63c located far from the output electrode 44, and extends across the fold portion 60 and the base 62, the base end 63c is positioned at the fold portion 60 and the tip end 63b is positioned at the base 62. The input electrode 46 is formed on the tip end 63b of the tongue portion 63. The tongue portion 63 may be formed only in the base 62 so that the tongue portion 63 does not extend in the fold portion 60 (so that both the base end 63c and the tip end 63b are located at the base 62).

Moreover, the plurality of input electroconductive wires 49 extending in direction A from the input electrode 46 of the tongue portion 63 extend across the tongue portion 63 and the fold portion 60, and are connected to the input terminal 50b of the circuit element 50. From among the plurality of input electroconductive wires 49, a VSS 2 wire 49a is extended up to the input terminal 50b along both outermost ends in X direction of the tongue portion 63. Moreover, the output electroconductive wires 48 each of which connects the output electrode 44 and the output terminal 50a of the circuit element 50 are wired to bypass a notch 63a which forms the tongue portion 63.

The output electroconductive wires 48 have output common wires COM which are drawn from the output electrodes 44 corresponding to the surface common electrodes 38a, and the other output electroconductive wires 48 which are drawn from the output electrodes 44 corresponding to the surface individual electrodes 37a. Since the surface common electrodes 38a, as shown in FIG. 4, are arranged on a surface of the actuator 32 at both end sides in the X direction, the output common wires COM are drawn along both side edges of an outermost end in a direction of width (X direction) of the flexible wiring member 4, and at an inner side thereof, the other output electroconductive wires 48 are drawn and connected to the output terminal 50a. The common wires COM are electrically connected to the VSS 2 wire 48a drawn from the output terminal 50a, by solder (a solder point 65) at a position near from the output terminal 50a. The common wires COM and the VSS 2 wire have a wire width wider than the other electroconductive wires.

Moreover, a projecting portion 64 which is projected in an outward direction is provided in advance to the flexible wiring member 4, at both side edges, parallel to the drawing direction A, of the base 62. By folding the protruding portion 64 toward the one surface 4a to press the fold portion 60, after the fold portion 60 is folded with respect to the base 62, an effect of the fold portion 60 being hardly separated is achieved. As a matter of course, for letting the fold portion 60 to be hardly separated from the base 62, other means such as an adhesive may be used.

The flexible wiring member 4 of the first embodiment structured in such manner, after the connecting terminals 39 of the actuator 32 and the output electrodes 44 of the flexible wiring member 4 are joined by an electroconductive brazing filler material, the common wires COM and the output VSS 2 wire 48a are electrically connected with each other, and the flexible wiring member is grounded. Thereafter, based on the broken line 61, the fold portion 60 is folded such that a portion, of the one surface 4a, corresponding to the fold portion 60 and another portion, of the one surface 4a, corresponding to the base 62 face with each other (refer to arrow B in FIG. 6C). Further, the tongue portion 63 is folded such that the tip end 63b of the tongue portion 63 is positioned on a side farther from the output electrode 44 than the broken line 61 (refer to arrow C in FIG. 6C). By folding the tongue portion 63, the opening 47 is formed in the base 62. From the opening 47, the circuit element 50 mounted on the one surface 4a of the fold portion 60 is exposed to the side of the other surface 4b, and a state shown in FIG. 6B and FIG. 6C is achieved. Moreover, in this state, the input electrode 46 provided at the tip end 63b of the tongue portion 63 is connected to the auxiliary wiring member 51, and the flexible wiring member 4 is assembled into the head holder 20.

In the flexible wiring member 4 having the abovementioned structure, all the connecting electrodes 45, the output electrodes 44, and the input electrode 46 are provided on the side of one surface 4a. Therefore, the electrodes are formed by removing the covering layer 43. Since it is easy to process the solder resist of the covering layer 43 as compared to the polyimide of the base layer 41, it is possible to form the electrodes while securing a sufficient accuracy even when the wiring pitch is fine, and to suppress an increase in a component cost.

Moreover, even when the flexible wiring member 4 is arranged so that the one surface 4a directs downward and faces the actuator 32 in order to connect the output electrodes 44 to the actuator 32, since the flexible wiring member 4 is provided with the fold portion 60 and the opening 47, it is possible to expose the circuit element 50, which is mounted on the one surface 4a, to the side of the other surface 4b (upper surface side). In other words, it is possible to arrange easily the circuit element 50 on an opposite side of the actuator 32 with respect to the flexible wiring member 4 without carrying out a particular processing such as cutting and adhering on the electroconductive wires which electrically connects the actuator 32 and the circuit element 50. Therefore, it is possible to bring the circuit element 50 in contact with the heat releasing body 52 easily.

Figure 8:
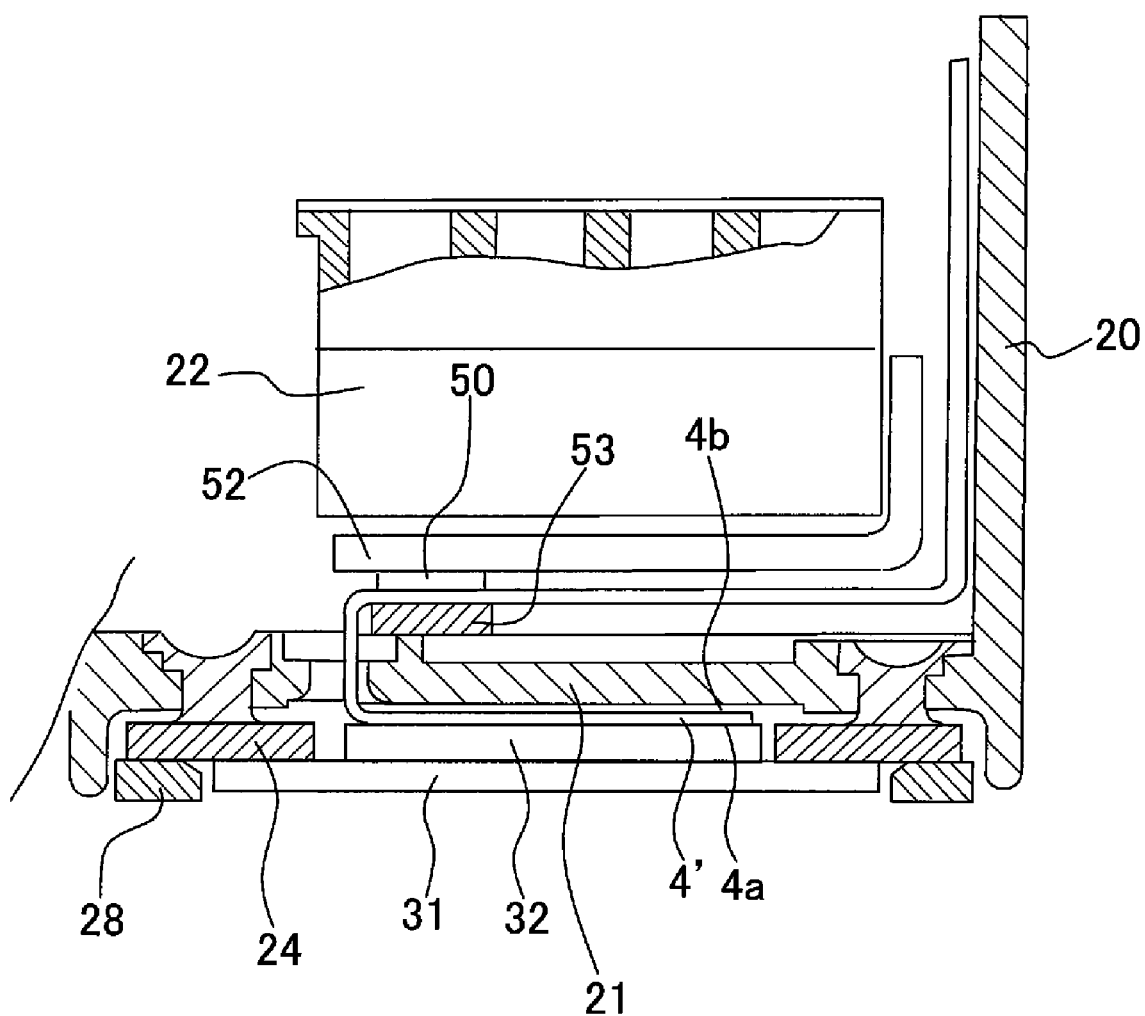
FIG. 8 is a diagram describing drawing around of a flexible wiring member in an example for comparison.

For example, as a form of wiring of a flexible wiring member which does not have the fold portion 60 and the opening 47, a form shown in FIG. 8, may be taken into consideration. In this form, after drawing a flexible wiring member 4' on the side of the upper surface of the bottom plate 21, the flexible wiring member 4' is folded so that the flexible wiring member 4' overlaps with the actuator 32 sandwiching the bottom plate 21 therebetween (horizontal U shape), and that the flexible wiring member 4' extends parallel to the bottom plate 21. In this form, the circuit element 50 mounted on the one surface 4a is exposed on the side of the upper surface. Accordingly, it is possible to bring the circuit element 50 into contact with the heat releasing body 52 arranged on an upper surface side of the flexible wiring member 4'.

However, in the form shown in FIG. 8, since the circuit element 50 is positioned above the actuator 32, sandwiching the bottom plate 21, even if the heat releasing body 52 is provided, the heat of the circuit element 50 is transmitted to the actuator 32 easily, and it is highly possible that the actuator 32 has an adverse effect due to heat.

Moreover, further applying the form shown in FIG. 8, a form, in which the flexible wiring member 4' is extended such that the circuit element 50 does not overlap with the actuator 32, and the circuit element 50 is mounted at a position near to the external signal source can also be taken into consideration. However, in this case there is an increase in an amount of usage of the flexible wiring member 4' which is a COF (chip on film), leading to an increase in the cost.

As compared to this, in the first embodiment, by using the fold portion 60 and the opening 47 described above, it is possible to bring the circuit element 50, which is exposed on the upper surface (the other surface 4b), in contact with the heat releasing body 52, at a position not overlapping with the upper side of the actuator 32. Therefore, the heat of the circuit element 50 and the heat transmitted to the heat releasing body 52 from the circuit element 50 are hardly transmitted to the actuator 32, and it is possible to reduce substantially an adverse effect due to heat on the actuator 32.

Embodiments from a second embodiment to a seventh embodiment, in which a similar effect as in the first embodiment is achieved, will be described below by using FIG. 9A to FIG. 14C. In each of the embodiments from the second embodiment to the seventh embodiment, the output electrodes 44 and the connecting electrodes 45 are provided on the side of the one surface (covering layer 43). The embodiments from the second embodiment to the fourth embodiment are embodiments in which a fold portion is folded toward the side of the one surface, and the embodiments from the fifth embodiment to the seventh embodiments are embodiments in which the fold portion is folded toward the side of the other surface. Same reference numerals are used for components similar as in the first embodiment, and the detailed description of such components is omitted.

Figure 9A:
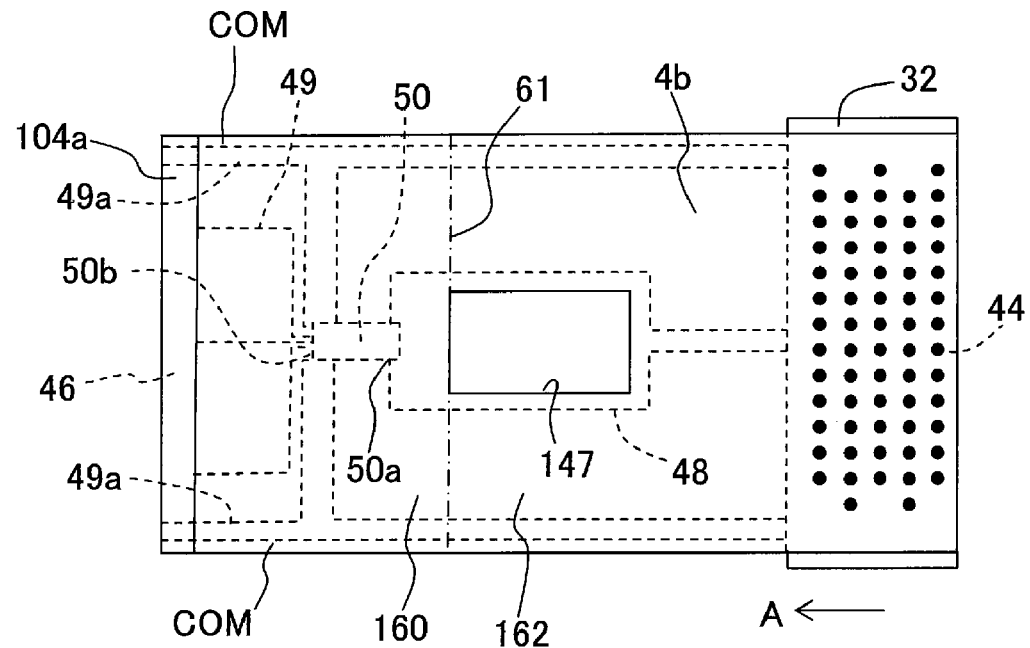
FIG. 9A is a plan view of a flexible wiring member of a second embodiment before being folded, as seen from a side of the other surface.
Figure 9B:
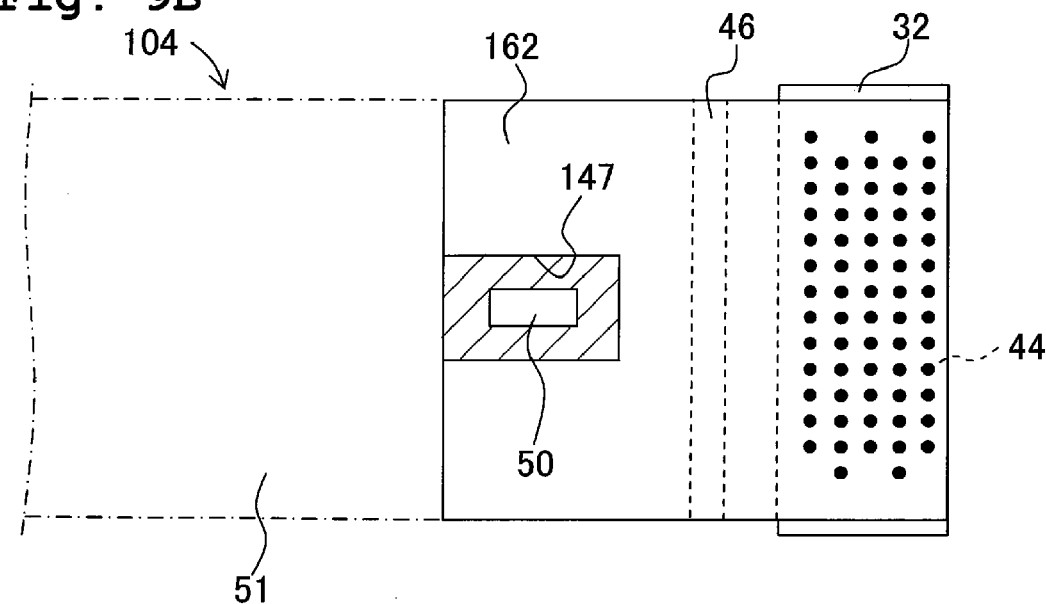
FIG. 9B is a plan view of the flexible wiring member of the second embodiment after being folded, as seen from a side of the other surface.
Figure 9C:
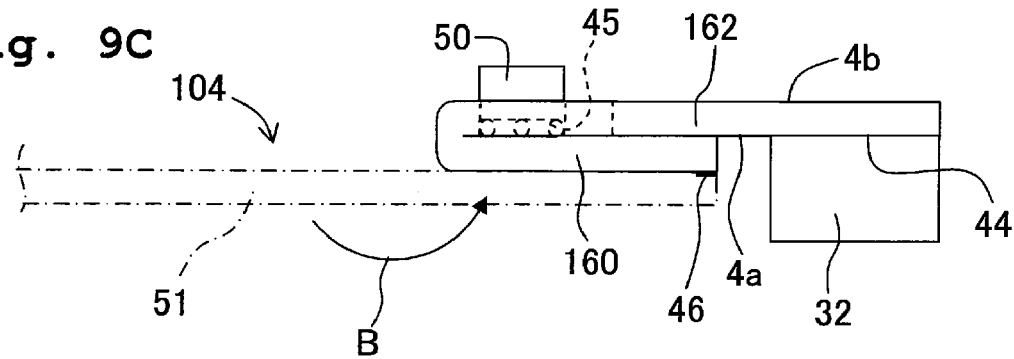
FIG. 9C is a schematic side view of the flexible wiring member of the second embodiment.

A flexible wiring member 104 of the second embodiment shown in FIG. 9A to FIG. 9C is not provided with a tongue portion, and an opening 147 is formed in advance through a base 162. Moreover, the input electrode 46 is provided at an end portion 104a on a side of a fold portion 160, far from the output electrode 44.

In the second embodiment, based on the broken line 61, the fold portion 160 is folded so that a portion, of the one surface 4a, corresponding to the fold portion 160 and another portion, of the one surface 4a, corresponding to the base 162 face with each other (refer to arrow B in FIG. 9B). Accordingly, the circuit element 50 is exposed toward the other surface 4b through an opening 147. In the second embodiment, the input electrode 46 is formed on the other surface 4b, and after the fold portion 160 is folded, the input electrode 46 is exposed on a lower surface side (refer to FIG. 9C), and is electrically connected to the auxiliary wiring member 51 overlapped on the lower surface. The common wires COM are drawn in direction A along both side edges at the outermost end in a direction (X direction) of the flexible wiring member 4 from the output electrode 44 corresponding to the surface common electrodes 38a, and are connected to the input electrode 46. The VSS 2 wires 49a are connected to the input terminals 50b of the circuit element 50, and the common wires COM and the VSS 2 wires 49a are connected by a solder point which is not shown in the diagram, on the auxiliary wiring member 51, and are grounded. The input electrode 46, for being less in number and not highly dense as described above, there are less technical difficulties even when formed on the side of the other surface 4b by exposing the base layer 41.

Figure 10A:
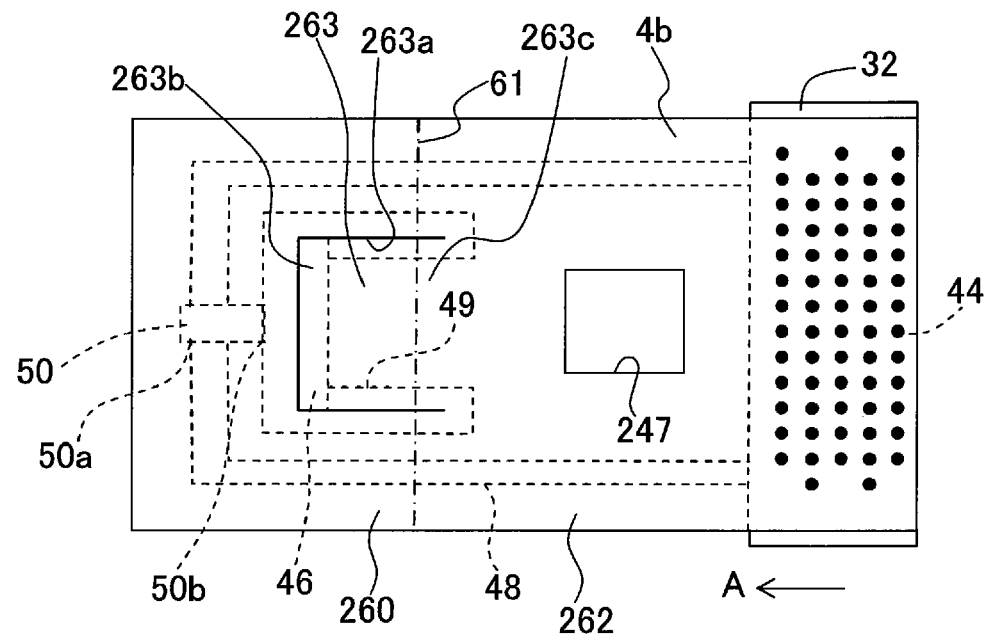
FIG. 10A is a plan view of a flexible wiring member of a third embodiment before being folded, as seen from a side of the other surface.
Figure 10B:
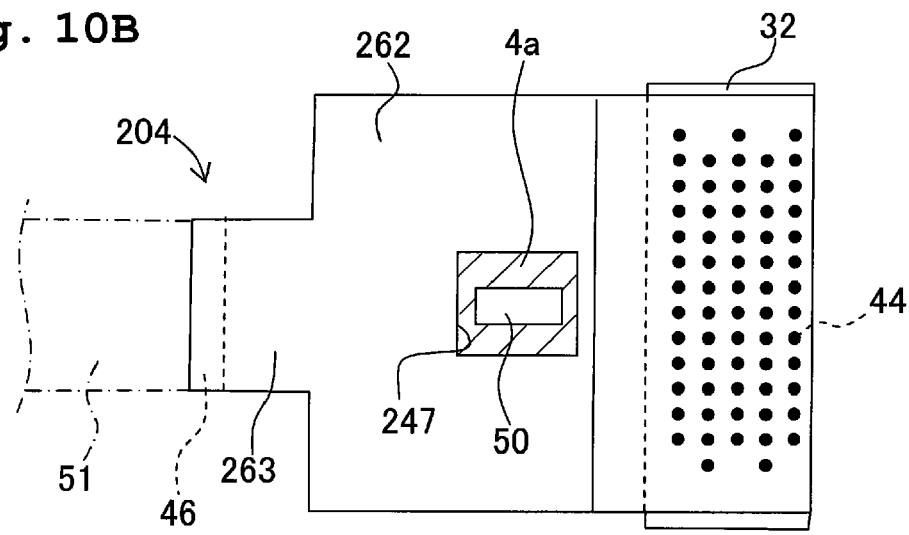
FIG. 10B is a plan view of the flexible wiring member of the second embodiment after being folded, as seen from a side of the other surface.
Figure 10C:
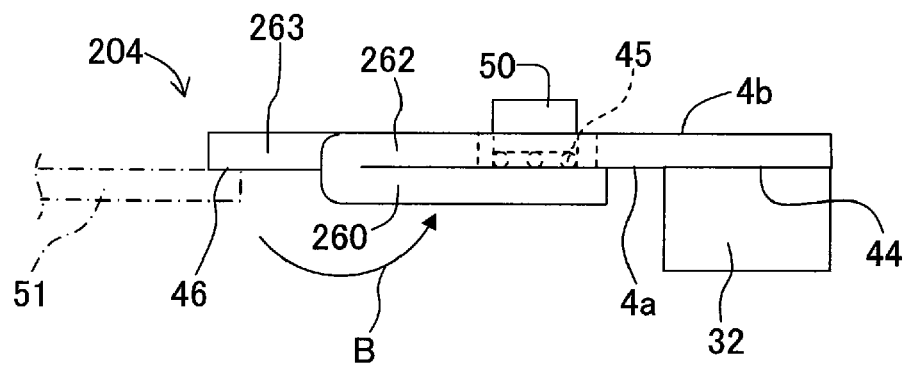
FIG. 10C is a schematic side view of the flexible wiring member of the third embodiment.

In a flexible wiring member 204 of the third embodiment shown in FIG. 10A to FIG. 10C, a tongue portion 263, extending across a fold portion 260 and a base 262, and having a base end 263c located near to the output electrode 44 and a tip end 263b located far from the output electrode 44, is formed by cutting a notch 263a. In the base 262, an opening 247 is formed in advance. An area of the opening 247 is formed to be greater than a shape of the circuit element 50 in a plan view. The input electrode 46 is formed at the tip end 263b of the tongue portion 263, and the input electroconductive wires 49 extend from the input electrode 46 to the input terminals 50b of the circuit element 50, bypassing the notch 263a of the tongue portion 263. The output electroconductive wires 48 extend from the circuit element 50 to the output electrodes 44, bypassing the tongue portion 263. By wiring in such manner, even when the tongue portion 263 is formed by cutting the notch 263a, it is possible to secure easily an electrical conduction between the input electrode and the circuit element 50, and an electrical conduction between the circuit element 50 and the actuator 32.

In the third embodiment, based on the broken line 61, a portion of the fold portion 260 different from the tongue portion 263 is folded such that a portion, of the one surface 4a, corresponding to the fold portion 260 and another portion, of the one surface 4a, corresponding to the base 262 face with each other (refer to arrow B in FIG. 10C). Accordingly, the circuit element 50 is exposed toward the other surface 4b from the opening 247, and the tongue portion 263 is projected from the broken line 61, toward a side far from the output electrodes 44. The auxiliary wiring member 51 is connected to the input electrode 46 of the tip end 263b of the tongue portion 263. Since the common wires COM and the VSS 2 wires are drawn around similarly as in the first embodiment, the description thereof is omitted.

Figure 11A:
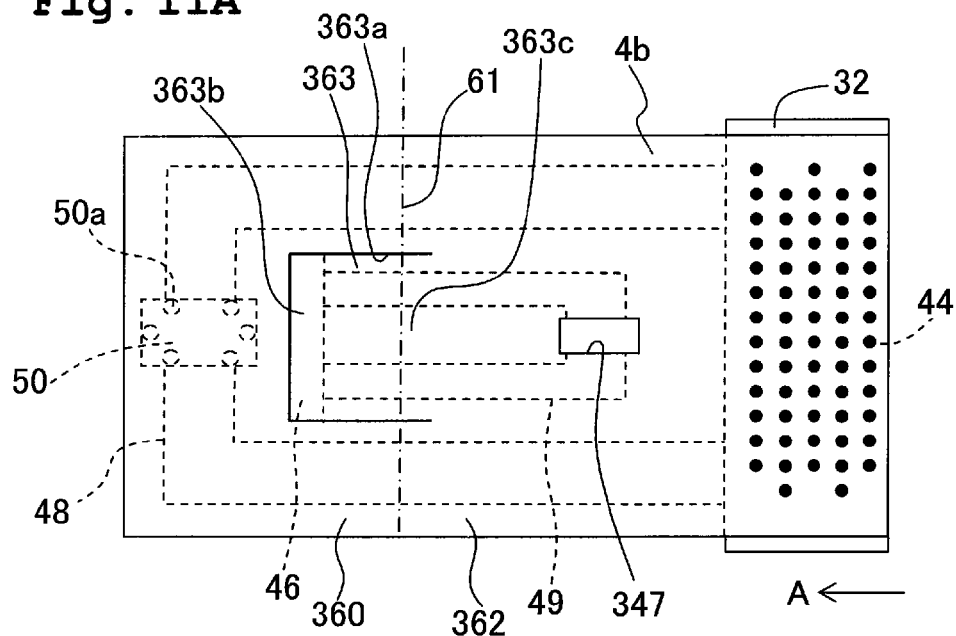
FIG. 11A is a plan view of a flexible wiring member of a fourth embodiment before being folded, as seen from a side of the other surface.
Figure 11B:
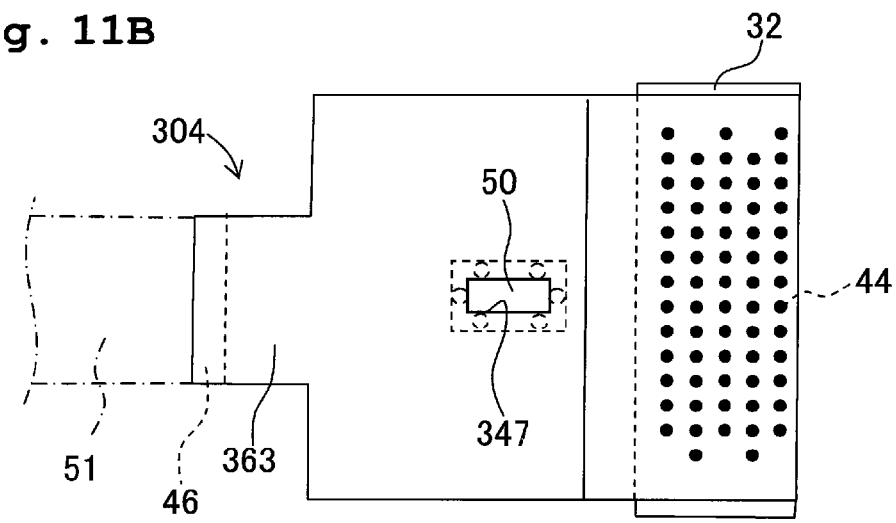
FIG. 11B is a plan view of the flexible wiring member of the fourth embodiment after being folded, as seen from a side of the other surface.
Figure 11C:
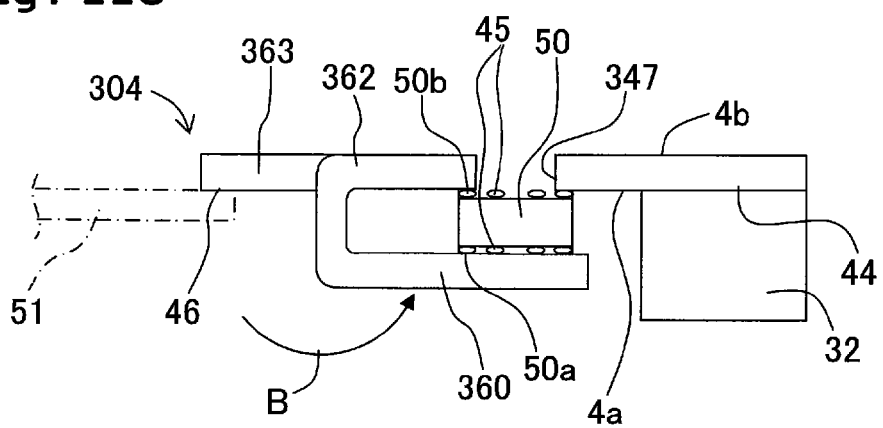
FIG. 11C is schematic side view of the flexible wiring member of the fourth embodiment.

In a flexible wiring member 304 of the fourth embodiment shown in FIG. 11A to FIG. 11C, a tongue portion 363, extending across a fold portion 360 and a base 362, and having a base end 363c located near to the output electrode 44 and a tip end 363b located far from the output electrode 44, is formed by cutting a notch 363a. In the base 362, an opening 347 is formed in advance, and an area of the opening 347 is formed to be smaller than a shape of the circuit element 50 in a plan view. The input electrode 46 is formed at the tip end 363b of the tongue portion 363.

The output terminals 50a and the input terminals 50b are provided to the circuit element 50, corresponding to the connecting electrodes 45. In this embodiment, the output terminals 50a of the circuit element 50 are formed on a surface, facing the one surface 4a, of the circuit element 50, and the input terminal 50b is formed on an opposite surface thereof (surface on a side of exposing). In the flexible wiring member 304 before being folded, only the output terminals 50a of the circuit element 50 are electrically connected to the connecting electrodes 45.

The output electroconductive wires 48 extend from the output terminals 50a of the circuit element 50 to the output electrodes 44, bypassing the tongue portion 363. The input electroconductive wires 49 extend from the input electrode 46 around a periphery of the opening 347, and the connecting electrodes 45 are formed around the opening 347. Moreover, based on the broken line 61, a portion of the fold portion 360 different from the tongue portion 363 is folded so that a portion, of the one surface 4a, corresponding to the fold portion 360 and another portion, of the one surface 4a, corresponding to the base 362 face with each other (refer to arrow B in FIG. 11C). Accordingly, a central portion of the circuit element 50 is exposed through the opening 347. Moreover, around the opening 347, the input terminals 50b of the circuit element 50 and the input electroconductive wires 49 face with each other, and are electrically connected. Accordingly, the input electroconductive wires 49 are connected to the input terminals 50b of the circuit element 50.

By folding the flexible wiring member 304 in such a manner described above, since the tongue portion 363 is projected from the broken line 61 toward a far side from the output electrode 44, the auxiliary wiring member 51 is connected to the input electrode 46 at the tip end 363b of the tongue portion 363.

In FIG. 11C, a dimension in a thickness direction is shown schematically in an emphasized manner. However, in reality, the flexible wiring member 304 is thin as compared to a thickness of the circuit element 50. Moreover, a distance between the fold portion 360 and the base 362 becomes extremely narrow after the circuit element 50 and the connected electrode 45 are connected. Therefore it is possible to bring the circuit element 50, of which the central portion is exposed through the opening 347, in contact sufficiently with the heat releasing body 52. Drawing of the common wires and the VSS 2 wires being similar as in the first embodiment, the description and diagram thereof are omitted.

Figure 12A:
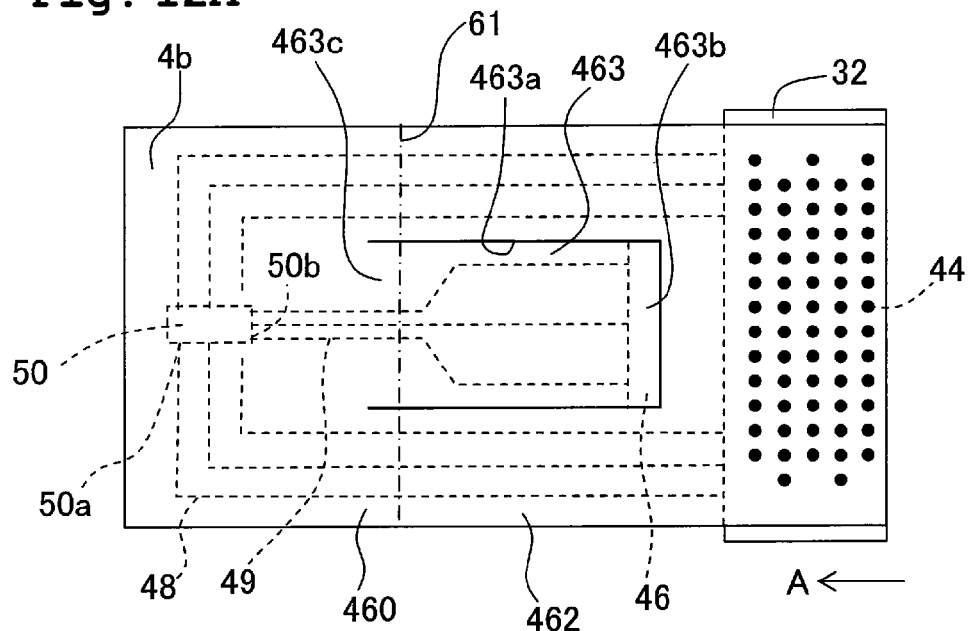
FIG. 12A is a plan view of a flexible wiring member of a fifth embodiment before being folded, as seen from a side of the other surface.
Figure 12B:
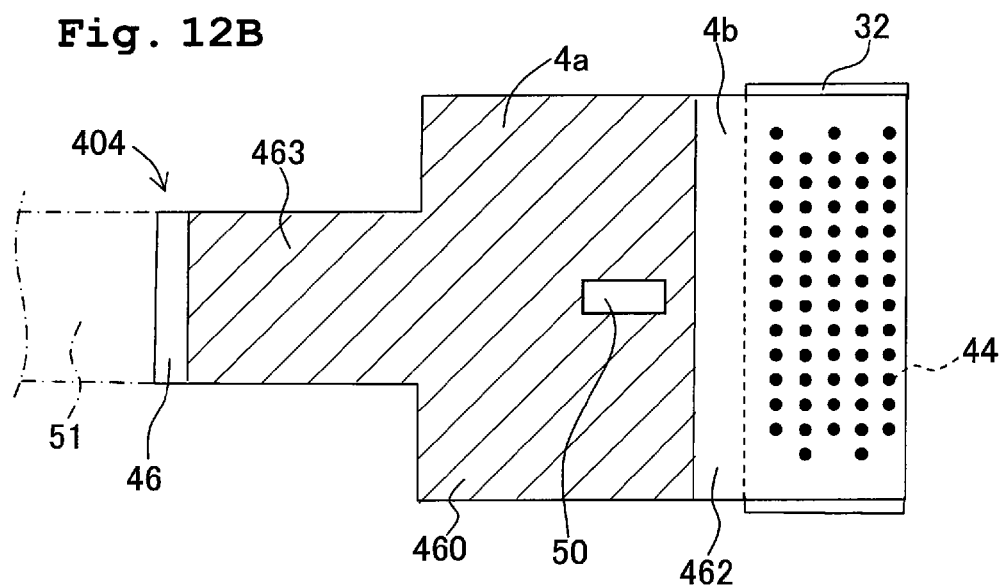
FIG. 12B is a plan view of the flexible wiring member of the fifth embodiment after being folded, as seen from a side of the other surface.
Figure 12C:
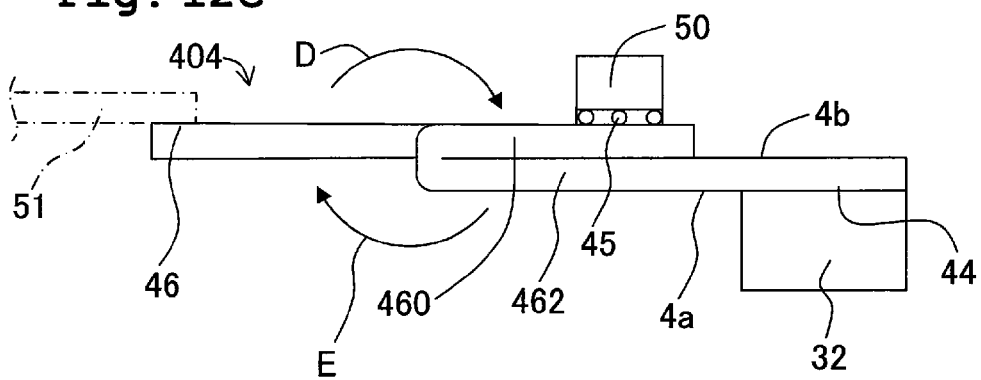
FIG. 12C is a schematic side view of the flexible wiring member of the fifth embodiment.

In a flexible wiring member 404 of the fifth embodiment shown in FIG. 12A to FIG. 12C, similarly as in the first embodiment, a tongue portion 463 is a tongue shape, having a tip end 463b located near to the output electrode 44 and a base end 463c located far from the output electrode 44. Since the tongue portion 463 is formed by cutting a notch 463a to extend across a fold portion 460 and a base 462, the base end 463c is positioned at the fold portion 460 and the tip end 463b is positioned at the base 462. The tongue portion 463 may be provided only to the base 462 (such that both the base end 463c and the tip end 463b are positioned at the base 462), and not extending across the fold portion 460. Moreover, the input electrode 46 is provided at the tip end 463b of the tongue portion 463.

In the fifth embodiment, based on the broken line 61, by folding the fold portion 460 so that a portion, of the other surface 4b, corresponding to the fold portion 460 and another portion, of the other surface 4b, corresponding to the base 462 face with each other (refer to arrow D in FIG. 12C), it is possible to expose directly the circuit element 50 mounted on the one surface 4a on the upper surface side, without being exposed through an opening portion. Furthermore, since the portions, of the surface of the flexible wiring member 4 on which electrodes are not formed, in other words, the portions, of the base layer having a superior durability, overlap with each other, even if there is a friction between the fold portion 460 and the base 462, it is possible to maintain the durability. Moreover, by folding the tongue portion 463 such that the tip end 463b of the tongue portion 463 is positioned at a far side from the output electrode 44 than the broken line 61 (refer to arrow E in FIG. 12C), the tongue portion 463 is protruded from the broken line 61. Moreover, since the input electrode 46 is provided at the tip end 463b of the tongue portion 463, it is possible to connect easily to the auxiliary wiring member 51. Wiring of the input electroconductive wires 49 and the output electroconductive wires 48 is similar as in the first embodiment. Drawing of the common wires COM and the VSS 2 wires being similar as in the first embodiment, the description and diagram thereof are omitted.

Figure 13A:
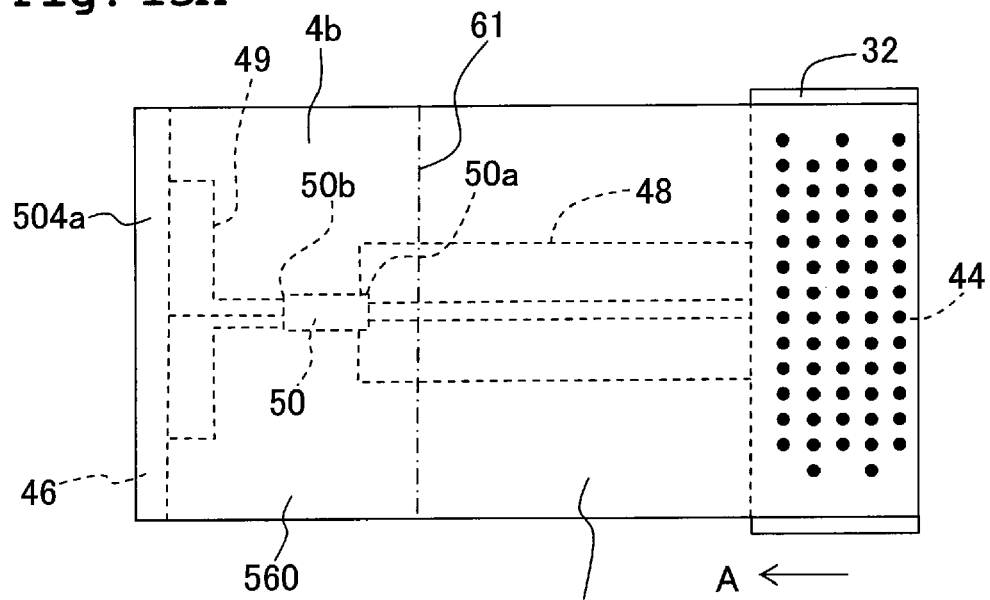
FIG. 13A is a plan view of a flexible wiring member of a sixth embodiment before being folded, as seen from a side of the other surface.
Figure 13B:
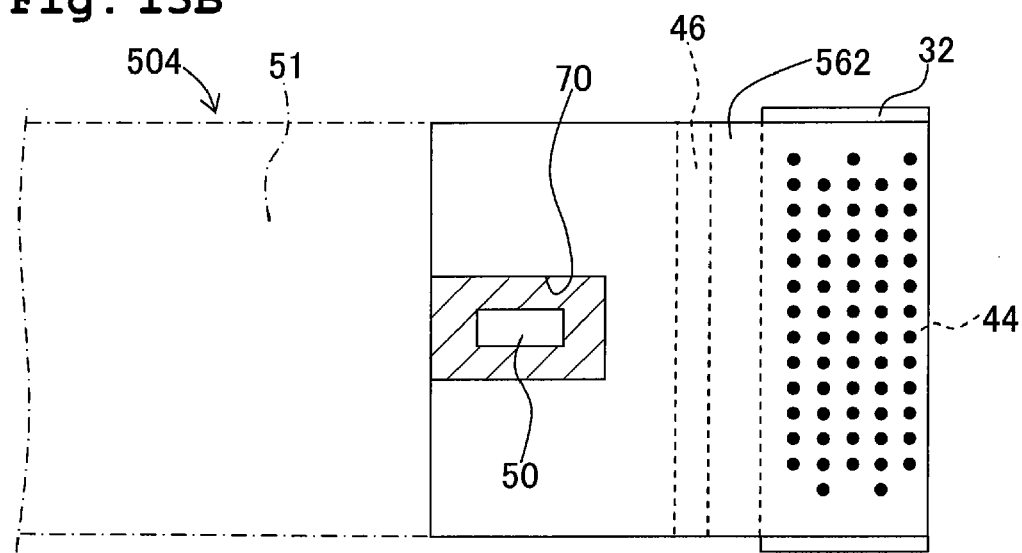
FIG. 13B is a plan view of the flexible wiring member of the sixth embodiment after being folded, as seen from a side of the other surface.
Figure 13C:
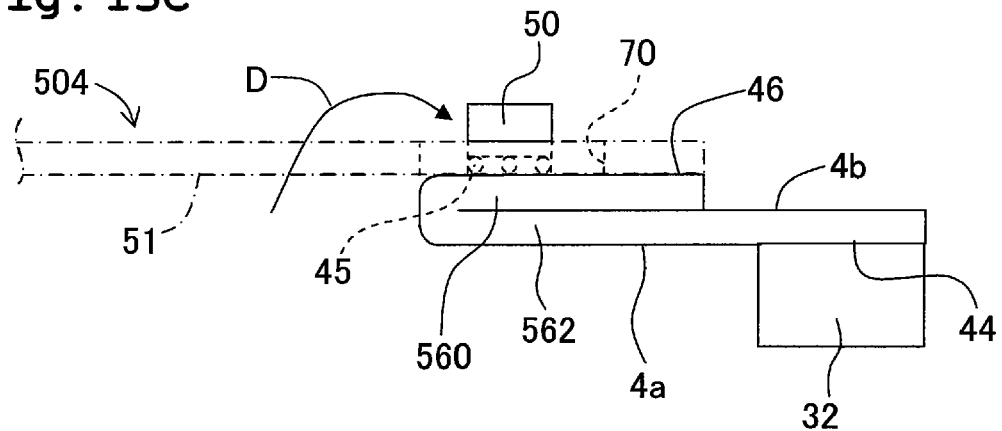
FIG. 13C is a schematic side view of the flexible wiring member of the sixth embodiment.

A flexible wiring member 504 of the sixth embodiment shown in FIG. 13A to FIG. 13C is not provided with a tongue portion and an opening, and an input electrode 46 is provided at an end portion 504a on a side far from the output electrodes 44 of the flexible wiring member 504 before being folded (a fold portion 560). Based on the broken line 61, when the fold portion 560 is folded so that a portion, of the other surface 4b, corresponding to the fold portion 560 and another portion, of the other surface 4b, corresponding to a base 562 face with each other (refer to arrow D in FIG. 13C), the circuit element 50 and the input electrode 46 are exposed on an upper surface side. Moreover, since the auxiliary wiring member 51 is overlapped on an upper surface thereof to connect to the input electrode 46, the auxiliary wiring member 51 is overlapped on an upper surface of the fold portion 560 (refer to FIG. 13C). A through hole 70 is formed in the auxiliary wiring member 51 in advance, and it is possible to expose the circuit element 50 toward an outer side of the upper surface side, via the through hole 70. Drawing of the common wires COM and the VSS 2 wires being similar as in the second embodiment, the description and diagram thereof are omitted.

Figure 14A:
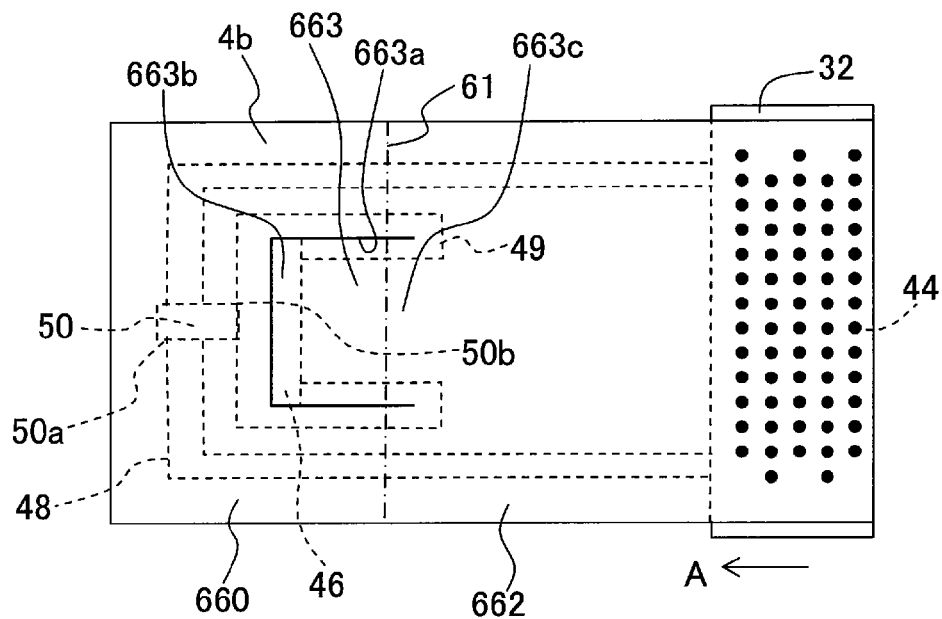
FIG. 14A is a plan view of a flexible wiring member of a seventh embodiment before being folded, as seen from a side of the other surface.
Figure 14B:
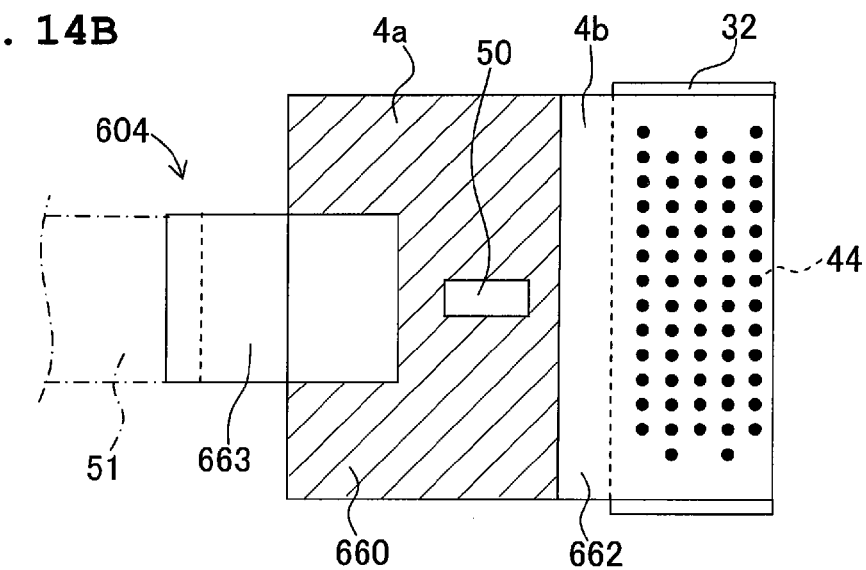
FIG. 14B is a plan view of the flexible wiring member of the seventh embodiment after being folded, as seen from a side of the other surface.
Figure 14C:
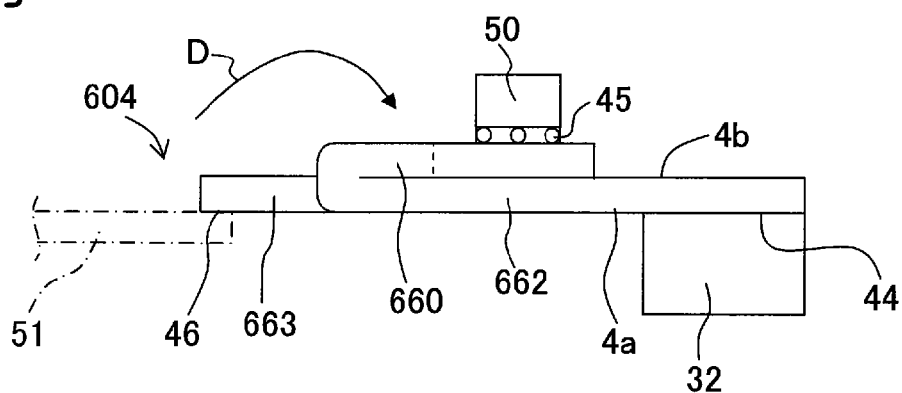
FIG. 14C is a schematic side view of the flexible wiring member of the seventh embodiment.

In a flexible wiring member 604 of a seventh embodiment shown in FIG. 14A to FIG. 14C, a tongue portion 663, having a base end 663c located near to the output electrode 44 and a tip end 663b located far from the output electrode 44, and extending across a fold portion 660 and a base 662, is formed by cutting a notch 663a. Based on the broken line 61, when a portion of the fold portion 660 different from the tongue portion 663 is folded so that a portion, of the other surface 4b, corresponding to the fold portion 660 and another portion, of the other surface 4b, corresponding to the base 662 face with each other (refer to arrow D in FIG. 14C), the circuit element 50 is exposed directly on the upper surface side. Moreover, the tongue portion 663 is protruded from the broken line 61 toward a side far from the output electrode 44. Moreover, since the input electrode 46 is provided at a tip end 663b of the tongue portion 663, it is possible to connect easily to the auxiliary wiring member 51. Drawing of the common wires COM and the VSS 2 wires being similar as in the first embodiment, the description and diagram thereof are omitted.

In this manner, the present invention is not restricted to the embodiments described above, and various modifications within the scope of basic teachings are possible. Moreover, since the flexible wiring member 4 is folded, it is also possible to apply a protruding portion 64 as in the first embodiment for preventing a floating and a curling. Moreover, the fold portion of the flexible wiring member 4 may be fixed by joining or adhering using an adhesive or an electroconductive brazing filler material such as solder.

In the embodiments described above, the description has been made by citing specific examples of shapes of the flexible wiring member, the electrodes, the tongue portion, and the opening, and materials of a base layer and a covering layer which are used in the flexible wiring member. However, the shapes and the materials are not restricted to those described in the abovementioned embodiments, and it is possible to use any shapes and materials provided that an effect of the present invention is shown.

Moreover, in the embodiments described above, the description has been made by using a jetting apparatus which jets an ink, as an electronic apparatus. However, the present invention is not restricted to the jetting apparatus which jets the ink. The present invention is also applicable to various electronic apparatuses in which electronic components are to be connected by a one-side wired flexible wiring member, in which a wiring pattern is formed on one surface of a base layer, and which has a covering layer to cover the wiring pattern, and in which various electrodes are formed only on the covering layer.

What is claimed is:
1. An electronic apparatus comprising:
an electrical load; and
a flexible wiring member, on which a circuit element is mounted, and which transmits by a plurality of electroconductive wires a signal from an external signal source to the electrical load via the circuit element,
wherein the flexible wiring member is a band-shaped member, and has, on one surface of the flexible wiring member, an output electrode via which the wiring member is connected to the electrical load and which is formed at an area facing the electrical load, and a connecting electrode on which the circuit element is mounted and which is formed in a drawn area, the electroconductive wires from the electrical load being drawn in the drawn area;
an opening is formed in the drawn area; and
the flexible wiring member is folded such that the circuit element is exposed through the opening to a side of the other surface of the flexible wiring member.

2. The electronic apparatus according to claim 1, wherein the circuit element exposed through the opening is in a close contact with a heat releasing body which is arranged on the side of the other surface of the flexible wiring member.

3. The electronic apparatus according to claim 2, wherein the heat releasing body is arranged at a position at which the heat releasing body does not overlap with the electrical load, in a plan view from the side of the other surface of the flexible wiring member.

4. The electronic apparatus according to claim 1, wherein the flexible wiring member has a base layer, a plurality of electroconductive wires arranged on the base layer and a covering layer which insulates and covers the electroconductive wires; and
    a surface, of the flexible wiring member, on which the covering layer is formed, is the one surface of the flexible wiring member.

5. The electronic apparatus according to claim 4, wherein the base layer is formed of polyimide and the covering layer is formed of solder resist.

6. The electronic apparatus according to claim 4, further comprising a jetting head which jets liquid droplets of a liquid, wherein the electrical load is an actuator which applies a jetting pressure to the liquid inside the jetting head; and
    the actuator is driven to jet the liquid droplets from the jetting head onto a recording medium.

7. The electronic apparatus according to claim 4, wherein the flexible wiring member has a fold portion on which the circuit element is mounted, and a base in which the opening is formed and which is positioned nearer to the output electrode than the fold portion before the fold portion is folded; and
    the circuit element is exposed through the opening to the side of the other surface by folding the fold portion toward the base such that a portion, of the one surface, corresponding to the fold portion and another portion, of the one surface, corresponding to the base face with each other.

8. The electronic apparatus according to claim 7, wherein
    a notch is cut in the flexible wiring member to form a tongue portion which has a tip end located near to the output electrode and a base end located far from the output electrode, and which extends across the base or across the fold portion and the base;
    the opening is formed in the base by folding the tongue portion toward the fold portion before the fold portion is folded such that a portion of the other surface, corresponding to the tongue portion, and the portion of the other surface, corresponding to the fold portion before the fold portion face with each other; and
    an input electrode via which the flexible wiring member is connected to the external signal source is formed on the tip end of the tongue portion.

9. The electronic apparatus according to claim 8, wherein an input electroconductive wire which connects the input electrode and the circuit element is formed on the tongue portion; and
    an output electroconductive wire which connects the circuit element and the output electrode is wired to bypass the notch forming the tongue portion.

10. The electronic apparatus according to claim 7, wherein an input electrode via which the flexible wiring member is connected to the external signal source is formed on the flexible wiring member at an end portion far from the output electrode.

11. The electronic apparatus according to claim 7, wherein a notch is cut in the flexible wiring member before the fold portion is folded to form a tongue portion having a base end located near to the output electrode and a tip end located far from the output electrode, and which extends across the fold portion, or across the fold portion and the base;
    an input electrode via which the flexible wiring member is connected to the external signal source is formed on the tip end of the tongue portion; and
    a portion, of the fold portion, which is different from the tongue portion is folded toward the base.

12. The electronic apparatus according to claim 11, wherein an input electroconductive wire which connects the input electrode and the circuit element is wired to bypass the notch forming the tongue portion.

13. The electronic apparatus according to claim 11, wherein an output terminal is formed on a surface, of the circuit element, facing the one surface;
    an input terminal is formed on the other surface, of the circuit element, opposite to the surface on which the output terminal is formed;
    the opening is formed to have an area smaller than an area of the circuit element in a plan view;
    an input electroconductive wire is wired to connect a periphery of the opening and the input electrode; and
    the fold portion is folded to make the input electroconductive wire and the input terminal of the circuit element face with each other at the periphery of the opening and to be connected electrically with each other.

14. An electronic apparatus comprising:
an electrical load; and
a flexible wiring member on which a circuit element is mounted, and which transmits by a plurality of electroconductive wires a signal from an external signal source to the electrical load via the circuit element,
wherein: the flexible wiring member is a band-shaped member, and has, on one surface thereof, an output electrode via which the flexible wiring member is connected to the electrical load and which is formed at an area facing the electrical load;
the flexible wiring member has a drawing area in which the electroconductive wires from the electrical load are drawn, and a connecting electrode on which the circuit element is mounted;
the flexible wiring member is folded such that the circuit element is exposed to a side of the other surface of the flexible wiring member, and that the circuit element does not overlap with the electrical load in a direction of thickness of the flexible wiring member.

15. The electronic apparatus according to claim 14, wherein the exposed circuit element is in a close contact with a heat releasing body which is arranged on the side of the other surface of the flexible wiring member.

16. The electronic apparatus according to claim 14, wherein the flexible wiring member has a base layer, a plurality of electroconductive wires arranged on the base layer, and a covering layer which covers and insulates the electroconductive wires; and
    a surface, of the flexible wiring member, on which the covering layer is formed is the one surface.

17. The electronic apparatus according to claim 15, wherein the heat releasing body is arranged at a position at which the heat releasing body does not overlap with the electrical load, in a plan view from a side of the other surface of the flexible wiring member.

18. The electronic apparatus according to claim 16, wherein the base layer is formed of polyimide; and the covering layer is formed of a solder resist.

19. The electronic apparatus according to claim 16, further comprising: a jetting head which jets liquid droplets of a liquid,
    wherein: the electrical load is an actuator which applies a jetting pressure to the liquid inside the jetting head; and
    the actuator is driven to jet the liquid droplets from the jetting head onto a recording medium.

20. The electronic apparatus according to claim 16, wherein the flexible wiring member has a fold portion on which the circuit element is mounted, and a base which is positioned nearer to the output electrode than the fold portion;

a notch is cut in the flexible wiring member to form a tongue portion which has a tip end located near to the output electrode and a base end located far from the output electrode, and which extends across the base, or across the fold portion and the base;

an input electrode via which the flexible wiring member is connected to the external signal source is formed on the tip end of the tongue portion;

the tongue portion is folded toward the fold portion before the fold portion is folded such that a portion, of the one surface, corresponding to the tongue portion and a portion, of the one surface, corresponding to the fold portion face with each other and the fold portion is folded toward the base such that a portion, of the other surface, corresponding to the fold portion and a portion, of the other surface, corresponding to the base face with each other to thereby expose the circuit element to the side of the other surface.

21. The electronic apparatus according to claim 20, wherein an input electroconductive wire which connects the input electrode and the circuit element is formed on the tongue portion; and an output electroconductive wire which connects the circuit element and the output electrode is wired to bypass the notch forming the tongue portion.

22. The electronic apparatus according to claim 16, further comprising another flexible wiring member which connects the input electrode and the external signal source, wherein the input electrode is formed on the flexible wiring member at an end portion located far from the output electrode;

the input electrode is connected to the another flexible wiring member;

a through hole is formed through the another flexible wiring member;

the another flexible wiring member is overlapped to face the one surface of the fold portion after the fold portion is folded to expose the circuit element through the through hole.

23. The electronic apparatus according to claim 16, wherein the flexible wiring member has a fold portion on which the circuit element is mounted, and a base which is positioned nearer to the output electrode than the fold portion;

a notch is cut in the flexible wiring member to form a tongue portion which has a tip end located far from the output electrode and a base end located near to the output electrode, and which extends across the fold portion, or across the fold portion and the base;

an input electrode via which the flexible wiring member is connected to the external signal source is formed on the tip end of the tongue portion;

the fold portion is folded toward the base such that a portion, of the other surface, corresponding to the fold portion and a portion, of the other surface, corresponding to the base face with each other to make the tongue portion project from the base and to expose the circuit element to a side of the other surface.

24. The electronic apparatus according to claim 23, wherein an input electroconductive wire which connects the input electrode and the circuit element is formed on the tongue portion; and the input electroconductive wire is wired to bypass the notch forming the tongue portion.

25. A band-shaped flexible wiring member, comprising:

a base layer;

an electroconductive wire which is wired on one surface of the base layer;

a covering layer which is formed on the base layer and which covers the electroconductive wire;

an output electrode which is formed on the covering layer; and a circuit element which is mounted on the covering layer, wherein the flexible wiring member is folded and fixed such that the circuit element is exposed to a side opposite to the output electrode with respect to the flexible wiring member and that the circuit element does not overlap with the output electrode in a thickness direction of the flexible wiring member.

26. The flexible wiring member according to claim 25, wherein an area, of the flexible wiring member, on which the circuit element is mounted is folded.

27. The flexible wiring member according to claim 26, wherein the base layer is formed of polyimide and the covering layer is formed of solder resist.

* * * * *